US006509109B1

(12) United States Patent
Nakamura et al.

(10) Patent No.: US 6,509,109 B1
(45) Date of Patent: Jan. 21, 2003

(54) ORGANIC ELECTROLUMINESCENT DEVICE

(75) Inventors: Hiroaki Nakamura, Sodegaura (JP); Chishio Hosokawa, Sodegaura (JP); Kenichi Fukuoka, Sodegaura (JP); Hiroshi Tokailin, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 0 days.

(21) Appl. No.: 09/281,953

(22) Filed: Mar. 31, 1999

(30) Foreign Application Priority Data

| Apr. 8, 1998 | (JP) | 10-096220 |
| Apr. 9, 1998 | (JP) | 10-114123 |
| Sep. 10, 1998 | (JP) | 10-257275 |

(51) Int. Cl.$^7$ ............................................. H05B 33/00
(52) U.S. Cl. ..................... 428/690; 428/917; 313/504; 313/506
(58) Field of Search ................ 428/690, 917; 313/504, 506

(56) References Cited

U.S. PATENT DOCUMENTS 5,652,067 A * 7/1997 Ito et al. ..................... 428/690
5,705,284 A * 1/1998 Hosokawa et al. ......... 428/690
6,013,384 A    1/2000 Kido et al. ................. 428/690
6,203,933 B1 * 3/2001 Nakaya et al. ............. 428/690

* cited by examiner

Primary Examiner—Cynthia H. Kelly
Assistant Examiner—Dawn Garrett
(74) Attorney, Agent, or Firm—Oblon, Spivak, McClelland, Maier & Neustadt, P.C.

(57) ABSTRACT

An organic EL device is improved to produce an increased luminance and have a prolonged lifetime. In an organic EL device comprising a cathode layer 16, an electron injection region 14, a light emission region 12 and an anode layer 10 as laminated in that order, the electron injection region 14 contains an aromatic compound composed of carbon and hydrogen or an aromatic compound composed of carbon, hydrogen and oxygen, along with a reducing dopant, and the electron affinity of the electron injection region is controlled to fall between 1.8 and 3.6 eV; or the electron injection region 14 contains an electron-transporting compound and a reducing dopant having a work function of at most 2.9 eV, and the electron affinity of the electron injection region is controlled to fall between 1.8 and 3.6 eV.

28 Claims, 10 Drawing Sheets

ORGANIC ELECTROLUMINESCENT DEVICE

BACKGROUND OF THE INVENTION

1. Field of the Invention

The present invention relates to an organic electroluminescent (EL) device. More precisely, it relates to an organic EL device suitable to light sources for displays, printer heads and others for domestic and industrial use.

2. Description of the Related Art

Reference 1, JP-A-4-297076 discloses one example of conventional organic EL devices. As in FIG. 10, the organic EL device 60 disclosed by Reference 1 comprises an organic laminate layer of three organic films 52, 54 and 56 as sandwiched between a cathode layer 58 and an anode layer 50 of a transparent electrode. Of the three organic films, the first organic film 52 that is adjacent to the cathode layer 58 is doped with a donor impurity, while the second organic film 54 that is adjacent to the anode layer 50 is doped with an acceptor impurity. As the acceptor impurity, used is any of CN-substituted compounds and quinone compounds (e.g., chloranil). The third organic film 56 sandwiched between the first organic film 52 and the second organic film 54 is a light emission layer. Carriers are confined in the light emission layer 56 by the adjacent first and second organic films 52 and 54. Accordingly, the organic EL device 60 could produce high luminance (that is, its luminous efficiency is high) even at low driving voltage.

Reference 2, "Digest of Technical Papers, SID'97, p. 775, 1997" discloses another example of conventional organic EL devices. In the organic EL device disclosed by Reference 2, the electron transportation layer is made of a material that comprises tris(8-hydroxyquinoline)Al (Alq complex) with Li added thereto.

In the organic EL device disclosed by Reference 1, CN-substituted compounds and quinone compounds used as the acceptor impurity have good electron transportation capabilities but their acceptor capabilities are strong. Concretely, their electron affinity is on the level of at least 3.7 eV and is high. Therefore, the acceptor impurity of those compounds often reacts with compounds that constitute the light emission region, thereby forming charge-transfer complexes or exciplexes. For these reasons, the organic EL device faces the problems of luminance depression and short lifetime.

In addition, in the organic EL device disclosed by Reference 1, the difference in the electron affinity between the donor impurity-doped, first organic layer and the light emission region is at least 0.5 eV and is large. Therefore, in this, a blocking contact is formed at the interface between the first organic layer and the light emission region. In that condition, the electron injection from the first organic layer to the light emission region is often unsatisfactory, and, as a result, the organic EL device shall face an additional problem of further reduction in its luminous efficiency.

On the other hand, Alq complexes in the organic EL device disclosed by Reference 2 also contain nitrogen atoms. In this, the electron transportation layer that comprises such an Alq complex and a Li compound has good electron transportation capabilities, but easily forms charge-transfer complexes or exciplexes. In addition, the organic EL device often requires high driving voltage. Therefore, like that disclosed by Reference 1, the organic EL device disclosed by Reference 1 also faces the problems of luminance depression and short lifetime.

SUMMARY OF THE INVENTION

Given that situation, we, the present inventors assiduously studied the problems noted above, and, as a result, have found that, when a nitrogen-free aromatic compound is used in the electron injection region, or when a nitrogen-containing aromatic compound, if used in that region, is combined with a specific reducing dopant, then the driving voltage for the organic EL device can be reduced and the luminance of the device can be increased and, in addition, the lifetime of the device can be prolonged. Based on these findings, we have completed the present invention. Specifically, the object of the invention is to provide an organic EL device that produces high luminance even at low driving voltage and has a long lifetime.

According to the first aspect of the invention, there is provided an organic EL device comprising at least an anode layer, a light emission region, an electron injection region and a cathode layer as laminated in that order, wherein the electron injection region contains a nitrogen-free aromatic compound and a reducing dopant and the electron affinity of the electron injection region is controlled to fall between 1.8 and 3.6 eV.

As containing a nitrogen-free aromatic compound, the electron injection region has good electron injection capabilities, and, in addition, this is prevented from reacting with the material that constitutes the light emission region adjacent thereto. Specifically, the nitrogen-free aromatic is composed of carbon and hydrogen, or of carbon, hydrogen and oxygen, and does not have any nitrogen-containing groups such as nitrogen-containing aromatic groups and electron-attractive groups (e.g., —CN, —NO$_2$, amido, imido). Therefore, in the constitution of the organic EL device of the invention, charge-transfer complexes or exciplexes with low luminous efficiency are well prevented from being formed in the interface between the electron injection region and the light emission region.

In addition, since the electron injection region contains a reducing dopant along with a nitrogen-free aromatic compound, the aromatic skeleton of the nitrogen-free aromatic compound in the region is well reduced to be in an anionic state. Accordingly, in the organic EL device of the invention, charge-transfer complexes or exciplexes with low luminous efficiency are much more prevented from being formed, whereby the luminance of the device is increased and the lifetime thereof is prolonged.

Moreover, since its electron affinity is suitably controlled, the electron injection region shall have more improved electron injection capabilities, and, in addition, charge-transfer complexes or exciplexes are well prevented from being formed at the interface between the electron injection region and the light emission region. Further, the blocking contact is prevented from being formed at the interface between the electron injection region and the light emission region. With that constitution, therefore, the luminance of the device is increased and the lifetime thereof is prolonged.

In the organic EL device of the first aspect of the invention, it is desirable that the electron injection region has a glass transition point of not lower than 100° C.

The organic EL device in which the electron injection region has a glass transition point of not lower than 100° C. could have high heat resistance. For example, the device is resistant to heat at a temperature of 85° C. or higher. In the device with that constitution, the electron injection region is protected from being broken within a short period of time by the Joule s heat to be generated through current injection from the current injection layer to the light emission region while the device is driven to emit light. As a result, the device could have a prolonged lifetime.

In the organic EL device of the first aspect of the invention, it is also desirable that the aromatic compound contains a residue of at least one aromatic ring selected from the group consisting of anthracene, fluorene, perylene, pyrene, phenanthrene, chrysene, tetracene, rubrene, terphenylene, quaterphenylene, sexiphenylene and triphenylene.

In the organic EL device of the first aspect of the invention, it is still desirable that the aromatic compound contains a residue of at least one aromatic ring selected from the group consisting of styryl-substituted aromatic rings, distyryl-substituted aromatic rings and tris-styryl-substituted aromatic rings.

In the organic EL device of the first aspect of the invention, it is still desirable that the reducing dopant is at least one substance selected from the group consisting of alkali metals, alkaline earth metals, rare earth metals, alkali metal oxides, alkali metal halides, alkaline earth metal oxides, alkaline earth metal halides, rare earth metal oxides and rare earth metal halides.

In the organic EL device of the first aspect of the invention, it is still desirable that the reducing dopant has a work function of at most 3.0 eV.

In the device, the reducing dopant having such a specifically defined work function could satisfactorily exhibit its reducing ability. With the reducing dopant, therefore, the driving voltage for the device can be reduced, and, in addition, the luminance of the device can be increased and the lifetime thereof can be prolonged.

In the organic EL device of the first aspect of the invention, it is still desirable that the reducing dopant is at least one alkali metal selected from the group consisting of Li, Na, K, Rb and Cs.

The reducing dopant of that type has especially high reducing ability. Therefore, even though a relatively small amount of the reducing dopant is added thereto, the device could produce much increased luminance of, for example, a high value of at least 500 cd/m$^2$ (when driven at 7 V), and, in addition, its lifetime is much prolonged. For example, the device has a half lifetime of 1000 hours or longer.

In the organic EL device of the first aspect of the invention, it is still desirable that the energy gap in the electron injection region is at least 2.7 eV.

Having such a large value of energy gap, the electron injection region is well protected from hole transfer thereinto. In that condition, therefore, the electron injection region itself is prevented from emitting light.

In the organic EL device of the first aspect of the invention, it is still desirable that the ratio of the aromatic compound to the reducing dopant in the electron injection region falls between 1:20 and 20:1 (by mol).

If the ratio of the aromatic compound to the reducing dopant in the electron injection region oversteps the defined range, the luminance of the organic EL device will lower and the lifetime thereof will be shortened.

In the organic EL device of the first aspect of the invention, it is still desirable that both the light emission region and the electron injection region contain the same nitrogen-free aromatic compound.

Containing the same nitrogen-free aromatic compound, the adhesion of the two regions is good. As a result, electrons are smoothly transferred from the electron injection region to the light emission region, and, in addition, the mechanical strength of the device is increased.

In the organic EL device of the first aspect of the invention and also in that of the second aspect of the invention to be mentioned hereinunder, it is still desirable to provide an interlayer between the cathode layer and the electron injection region and/or between the anode layer and the light emission region.

With such an interlayer, the luminance of the device and even the half lifetime thereof can be greatly increased and prolonged.

According to another aspect (the second aspect) of the invention, there is provided an organic EL device comprising at least an anode layer, a light emission region, an electron injection region and a cathode layer as laminated in that order, wherein the electron injection region contains an electron-transporting compound and a reducing dopant having a work function of at most 2.9 eV, and the electron affinity of the electron injection region is controlled to fall between 1.8 and 3.6 eV.

In the device in which the electron injection region contains a reducing dopant with a specifically defined work function, even though the electron-transporting compound in that region is oxidized, the compound could be effectively reduced to be in an anionic state. Therefore, in the constitution of the organic EL device, charge-transfer complexes or exciplexes are well prevented from being formed. Accordingly, the driving voltage for the device can be reduced, the luminance of the device can be increased, and the lifetime thereof can be prolonged. Specifically, in the device of the second aspect, the reducing ability of the reducing dopant is high. Therefore, even when the electron-transporting compound in the device of the second aspect contains a nitrogen-containing group (or nitrogen atom) such as a nitrogen-containing aromatic ring or an electron-attractive group, being different from that in the device of the first aspect, the device of the second aspect still has the advantage of retarding the reaction of the electron-transporting compound with the material that constitutes the light emission region.

Moreover, since the electron affinity of the electron injection region is suitably controlled, charge-transfer complexes or exciplexes are well prevented from being formed in the interface between the electron injection region and the light emission region, and, in addition, the blocking contact is prevented from being formed at the interface between the electron injection region and the light emission region. With that constitution, therefore, the luminance of the device is increased and the lifetime thereof is prolonged.

In the organic EL device of the second aspect of the invention, it is desirable that the reducing dopant is at least one alkali metal or alkaline earth metal selected from the group consisting of Na, K, Rb, Cs, Ca, Sr and Ba.

The reducing dopant of that type has especially high reducing ability. Therefore, even though a relatively small amount of the reducing dopant is added thereto, the device could produce much increased luminance of, for example, a high value of at least 500 cd/m$^2$ (when driven at 7 V), and, in addition, its lifetime is much prolonged. For example, the device has a half lifetime of 1000 hours or longer.

In the organic EL device of the second aspect of the invention, it is still desirable that the electron-transporting compound includes nitrogen-containing heterocyclic compounds.

Nitrogen-containing heterocyclic compounds have good electron-transporting ability. With that constitution, therefore, the device has the advantage of much higher electron injection capabilities.

In the organic EL device of the second aspect of the invention, it is still desirable that the nitrogen-containing heterocyclic compound is at least one selected from the group consisting of nitrogen-containing complexes, quinoxaline derivatives, quinoline derivatives, oxadiazole derivatives, thiadiazole derivatives and triazole derivatives.

In the organic EL device of the second aspect of the invention, it is still desirable that the ratio of the electron-transporting compound to the reducing dopant in the electron injection region falls between 1:20 and 20:1 (by mol).

If the ratio of the electron-transporting compound to the reducing dopant in the electron injection region oversteps the defined range, the luminance of the organic EL device will lower and the lifetime thereof will be shortened.

In the organic EL device of the second aspect of the invention, it is still desirable that the electron injection region has a glass transition point of not lower than 100° C.

With the electron injection region having such a specifically defined glass transition point, the heat resistance of the device is improved and the lifetime thereof is prolonged.

In the organic EL device of the second aspect of the invention, it is still desirable that both the light emission region and the electron injection region contain the same electron-transporting compound.

Containing the same electron-transporting compound, the adhesion of the two regions is good. As a result, electrons are smoothly transferred from the electron injection region to the light emission region, and, in addition, the mechanical strength of the device is increased.

Figure 1:
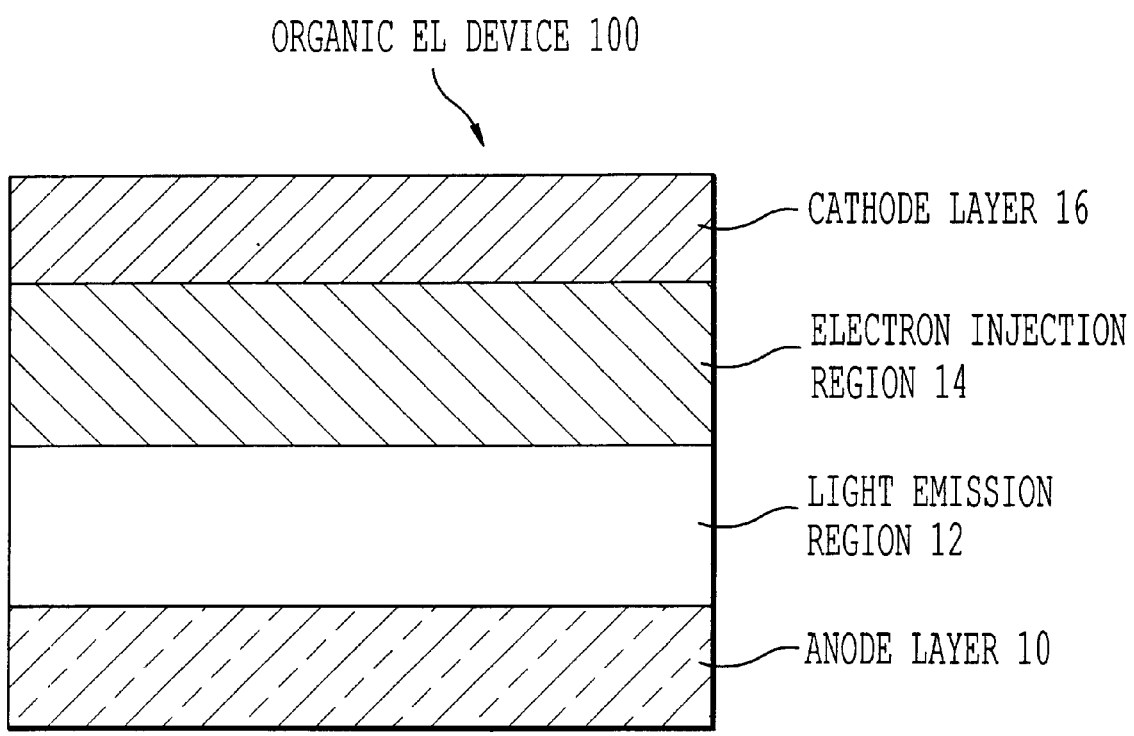
FIG. 1 is a cross-sectional view of an organic EL device of the first and second embodiments of the invention.

DESCRIPTION OF THE PREFERRED
EMBODIMENTS OF THE INVENTION

Embodiments of the invention are described below with reference to the drawings. The drawings referred to herein are to schematically show the dimension, the shape and the configuration of the constituent components to such a degree that they will be helpful in easy understanding of the invention. Therefore, the invention is not restricted to only the embodiments illustrated in those drawings. In the drawings, the hatching that indicates cross sections is often omitted.

First Embodiment

With reference to FIG. 1, the first embodiment of the organic EL device of the invention is described. FIG. 1 is a cross-sectional view of an organic EL device 100, which comprises an anode layer 10, a light emission region 12, an electron injection region 14 and a cathode layer 16 as laminated in that order on a substrate (not shown).

The electron injection region 14 is the characteristic part in the first embodiment, and is described in detail hereinunder. The other parts, such as the anode layer 10, the light emission region 12 and the cathode layer 16, will be described in brief for their structures and fabrication methods. For other parts not referred to herein, ordinary structures and fabrication methods known in the art of organic EL devices shall apply thereto.

(1) Electron Injection Region
Aromatic Compounds

The electron injection region in the first embodiment contains a nitrogen-free aromatic compound, or that is, contains an aromatic compound comprising carbon (C) and hydrogen (H), or an aromatic compound comprising carbon (C), hydrogen (H) and oxygen (O). The aromatic compound comprising carbon and hydrogen and the aromatic compound comprising carbon, hydrogen and oxygen may be used either singly or as combined.

Preferred examples of the nitrogen-free aromatic compound are those containing a residue of at least one aromatic ring selected from the group consisting of anthracene, fluorene, perylene, pyrene, phenanthrene, chrysene, tetracene, rubrene, terphenylene, quaterphenylene, sexiphenylene, triphenylene, picene, coronene, diphenylanthracene, benz[a]anthracene and binaphthalene.

More preferably, the nitrogen-free aromatic compounds contain a residue of tricyclic or more polycyclic aromatic rings such as anthracene, etc. Containing such a residue of tricyclic or more polycyclic aromatic rings, the compounds could have much more increased electron transfer capabilities, thereby increasing the luminance of the organic EL device and enhancing the fast responsibility thereof.

Even more preferably, the nitrogen-free aromatic compounds contain a residue of styryl-substituted aromatic rings, distyryl-substituted aromatic rings or tris-styryl-substituted aromatic rings.

Comprising the nitrogen-free aromatic compound that contains a residue of such styryl-substituted aromatic rings, the organic EL device could produce much more increased luminance and have a much more prolonged lifetime.

As the aromatic compounds containing a styryl-substituted group, for example, preferred are those having the following structural formula (1):

(1)

In formula (1), n represents a degree of condensation of the compound, and falls between 1 and 4. R represents a hydrogen atom, or an aromatic group (a residue of an aromatic ring) having from 6 to 40 carbon atoms. $Ar^1$ represents an aromatic group having from 6 to 40 carbon atoms; $Ar^2$ and $Ar^3$ each represent a hydrogen atom, or an aromatic group having from 6 to 40 carbon atoms. At least one of $Ar^1$, $Ar^2$ and $Ar^3$ is an aromatic group. Preferably, the aromatic group is composed of at least three condensed or linked rings.

As the nitrogen free aromatic compounds, for example, preferred are those having the following structural formula (2):

$$Ar^4—L—Ar^5 \quad (2)$$

In formula (2), L represents an arylene group having from 6 to 30 carbon atoms. The arylene group is preferably a phenylene, biphenylene, naphthylene or anthracene-diyl group.

Desirably, $Ar^4$ and $Ar^5$ each represent a residue of diphenylanthracene or diphenylpyrene.

It is desirable that the compounds of formula (1) or (2) are further substituted with any other substituents. As the substituents, preferred are any of an alkyl group having from 1 to 30 carbon atoms, an alkyloxy group having from 1 to 30 carbon atoms, an arylalkyl group having from 6 to 30 carbon atoms, a diarylamino group, an N-alkylcarbazolyl group and an N-phenylcarbazolyl group. Being substituted with any of those substituents, the aromatic compounds are more effectively prevented from forming complexes with low luminous efficiency.

Reducing Dopants

In the first embodiment, the electron injection region is characterized by containing a reducing dopant. The reducing dopant is herein meant to indicate a substance capable of reducing oxidized aromatic compounds. Therefore, the reducing dopant is not specifically defined, provided that it has the ability to reduce oxidized compounds. to a certain degree. Concretely, it is desirable that the reducing dopant for use herein is at least one substance selected from the group consisting of alkali metals, alkaline earth metals, rare earth metals, alkali metal oxides, alkali metal halides, alkaline earth oxides, alkaline earth halides, rare earth metal oxides and rare earth metal halides.

As preferred alkali metals, for example, mentioned are Li (lithium, having a work function of 2.93 eV), Na (sodium, having a work function of 2.36 eV), K (potassium, having a work function of 2.3 eV), Rb (rubidium, having a work function of 2.16 eV), and Cs (cesium, having a work function of 1.95 eV). The work function of each substance, as parenthesized, is described in Chemical Handbook (basic edition II, p. 493, edited by the Chemical Society of Japan), and the same shall apply hereinunder.

As preferred alkaline earth metals, for example, mentioned are Ca (calcium, having a work function of 2.9 eV), Mg (magnesium, having a work function of 3.66 eV), Ba (barium, having a work function of 2.52 eV), and Sr (strontium, having a work function of from 2.0 to 2.5 eV). The work function of strontium is described in Physics of Semiconductor Device (N.Y. Willow, 1969, p. 366).

As preferred rare earth metals, for example, mentioned are Yb (ytterbium, having a work function of 2.6 eV), Eu (europium, having a work function of 2.5 eV), Gd (gadolinium, having a work function of 3.1 eV), and Er (erbium, having a work function of 2.5 eV).

As preferred alkali metal oxides, for example, mentioned are $Li_2O$, LiO and NaO.

As preferred alkaline earth metal oxides, for example, mentioned are CaO, BaO, SrO, BeO and MgO.

As preferred alkali metal halides, for example, mentioned are fluorides such as LiF, NaF and KF, as well as LiCl, KCl and NaCl.

As preferred alkaline earth metal halides, for example, mentioned are fluorides such as $CaF_2$, $BaF_2$, $SrF_2$, $MgF_2$ and $BeF_2$, and other halides except such fluorides.

Other preferred examples of the reducing dopant are alkali metal-coordinated aromatic compounds. The alkali metal-coordinated aromatic compounds maybe represented, for example, by the following structural formula (3):

$$A^+Ar^{6-} \quad (3)$$

In formula (3), A represents an alkali metal, and $Ar^6$ represents an aromatic compound having from 10 to 40 carbon atoms. The aromatic compound in formula (3) includes, for example, anthracene, naphthalene, diphenylanthracene, terphenyl, quaterphenyl, quinquephenyl, sexiphenyl, and their derivatives.

The amount of the reducing dopant to be in the electron injection region is described. It is desirable that the amount of the reducing dopant to be in the electron region falls between 0.01 and 50% by weight, relative to the sum total of the components constituting the region of being 100% by weight. If the amount of the reducing dopant in the region is smaller than 0.01% by weight, the luminance of the organic EL device will be lowered and the lifetime thereof will be shortened. On the other hand, if the amount is larger than 50% by weight, the luminance of the device sill also be lowered and the lifetime thereof will be shortened.

Accordingly, in view of the good balance of increased luminance and prolonged lifetime of the device, it is more desirable that the amount of the reducing dopant in the electron injection region falls between 0.2 and 20% by weight.

Regarding the amount of the reducing dopant in the electron injection region, it is desirable that the ratio of the aromatic compound to the reducing dopant falls between 1:20 and 20:1 (by mol). If the ratio of the electron-transporting compound of the aromatic compound to the reducing dopant falls outside the defined range, the luminance of the organic EL device will be lowered and the lifetime thereof will be shortened.

Accordingly, it is more desirable that the ratio of the aromatic compound to the reducing dopant falls between 1:10 and 10:1 (by mol), even more preferably between 1:5 and 5:1.

Electron Affinity

It is desirable that the electron affinity of the electron injection region in the first embodiment falls between 1.8 and 3.6 eV. If the electron affinity is smaller than 1.8 eV, the electron injection capabilities of the region will lower, thereby often resulting in that the driving voltage for the device will increase and the luminous efficiency of the device will lower. On the other hand, if the electron affinity is larger than 3.6 eV, undesired complexes with low luminous efficiency will be readily formed and, in addition, the blocking contact will be unfavorably formed at the interface between the electron injection region and the light emission region.

Accordingly, it is more desirable that the electron affinity of the electron injection region falls between 1.9 and 3.0 eV, even more preferably between 2.0 and 2.5 eV.

It is still more desirable that the difference in the electron affinity between the electron injection region and the light emission region is at most 1.2 eV, even more preferably at most 0.5 eV. In the organic EL device in which the electron affinity difference between the two regions is smaller, the electron transfer from the electron injection region to the light emission region is easier. With that constitution, therefore, the device ensures fast response.

Glass Transition Point

It is desirable that the glass transition point (glass transition temperature) of the electron injection region in the first embodiment is 100° C. or higher, but more preferably falling between 105 and 200° C.

With the glass transition point of the electron injection region being defined as above, it is easy to increase the heat resistance of the organic EL device, or that is, the temperature at which the device is resistant to heat could be 85° C. or higher. In the device with that constitution, therefore, the electron injection region could be protected from being broken within a short period of time by the Joule's heat to be generated through current injection from the current injection layer to the light emission region while the device is driven to emit light. As a result, the device could have a prolonged lifetime.

Regarding the glass transition point of the electron injection region, the material constituting the region is heated in a nitrogen atmosphere at a heating rate of 10° C./min to prepare the specific heat change curve for the material according to differential scanning calorimetry (DSC). From the curve, the change point of the specific heat is obtained, and this indicates the glass transition point of the electron injection region. With this respect, the same shall apply to the other embodiments and Examples.

Energy Gap

It is desirable that the energy gap (band gap energy) in the electron injection region in the first embodiment is at least 2.7 eV, more preferably at least 3.0 eV.

With the energy gap being defined to be large and not smaller than a predetermined value, for example, not smaller than 2.7 eV, holes that may move into the electron injection region, having passed through the light emission region, could be reduced. With that constitution, therefore, the recombination of holes and electrons could be enhanced to increase the luminance of the organic EL device. In addition, in that condition, the electron injection region itself is prevented from emitting light.

Structure of Electron Injection Region

The structure of the electron injection region in the first embodiment is not specifically defined. It is not limited to only a single-layered structure. For example, the region may have any of a two-layered structure or a three-layered structure. In addition, the thickness of the electron injection region is not also specifically defined. Preferably, however, it falls between 0.1 nm and 1 μm, more preferably between 1 and 50 nm.

Method for Forming Electron Injection Region

The method for forming the electron injection region is described. The method for forming it is not specifically defined, provided that the region could be formed as a thin film layer having a uniform thickness. For example, any known method of vapor deposition, spin-coating, casting, LB or the like is employable for forming the region.

For forming the region, it is desirable that the nitrogen-free aromatic compound and the reducing dopant are deposited through simultaneous vapor deposition. The preferred vapor deposition method will be described in detail in the sixth embodiment to be mentioned hereinunder.

It is desirable that the electron injection region and the light emission region are formed in the same method. For example, when the light emission region is formed through vapor deposition, it is desirable that the electron injection region is formed also through vapor deposition. Employing the same method for forming the films of the two regions has the advantage of simplifying the equipment for the method and shortening the time for it, since the films of the electron injection region and the light emission region could be formed continuously in one process. Another advantage in such a continuous process is that the electron injection region and the light emission region being formed shall have few opportunities of being oxidized therein, whereby the luminance of the organic EL device could be increased.

(2) Light Emission Region

Constituent Material

The organic light-emitting material to be the constituent material for the light emission region preferably has the following three functions.

(a) Function of charge reception: While the device is in an electric field, the light emission region shall receive holes from the anode layer or the hole injection layer, while receiving electrons from the cathode layer or the electron injection region.

(b) Function of charge transportation: In the light emission region, the holes and electrons having been injected thereinto shall be moved owing to the force of the electric field.

(c) Function of light emission: The light emission region shall provide the site for recombination of the electrons and the holes to produce light emission.

However, it is not always necessary for the light emission region to have all those functions (a) to (c). For example, some organic light-emitting materials of which the ability of hole reception and transportation is much higher than that of electron reception and transportation could be favorably employed herein. One object of the invention is to promote the electron transfer into the light emission region to thereby lower the driving voltage for the organic EL device.

As preferred examples of the organic light-emitting materials for use in the invention, mentioned are fluorescent brighteners of benzothiazole compounds, benzimidazole compounds, benzoxazole compounds, etc.; as well as metal complexes with a ligand of styrylbenzene compounds or 8-quinolinol derivatives.

In addition, also preferably used are organic light-emitting materials having a distyrylarylene skeleton, for example, those as prepared by doping a host of 4,4'-bis (2,2-diphenylvinyl)biphenyl) or the like with a strong, blue to red phosphor dye of, for example, coumarin compounds or with a phosphor dye similar to the host.

Also preferably, the constituent material for the light emission region is partially the same as that for the electron injection region, and the same nitrogen-free aromatic compound is in the both regions. With that constitution, the adhesion between the two regions is enhanced and the mechanical strength of the device is increased, and, in addition, smooth transfer of electrons from the electron injection region to the light emission region is possible.

More preferably, the amount of the same aromatic compound to be in the light emission region and the electron injection region is at least 50% by weight, even more preferably at least 60% by weight.

Method for Forming Light Emission Region

The method for forming the light emission region is described. For forming it, any known method of, for example, vapor deposition, spin-coating, casting, LB or the like is employable.

As so mentioned hereinabove, it is desirable that the electron injection region and the light emission region are formed in the same method. For example, when the electron injection region is formed by vapor deposition, it is desirable that the light emission region is formed also by vapor deposition.

It is also desirable that the light emission region is of a molecular deposition film, for example, a thin film as formed by vapor deposition of a material compound of being in a vapor phase condition, or a film as formed through solidification of a material compound of being in a solution condition or in a liquid phase condition. In general, the molecular deposition film of that type could be differentiated from a thin film (molecular built-up film) to be formed through a method of LB, because of the difference therebetween in the aggregation structure and the high-order structure and of the functional difference therebetween resulting from it. Another method could be employable for forming the light emission region, which comprises dissolving an organic light-emitting material in a solvent along with a binder such as resin or the like to prepare a solution, followed by filming the resulting solution into a thin film through spin coating or the like.

Thickness of Light Emission Region

The thickness of the light emission region thus formed in the manner mentioned above is not specifically defined. Depending on the condition, the thickness of the region may be suitably varied, but preferably falls between 5 nm and 5 $\mu$m. If the thickness of the light emission region is smaller than 5 nm, the luminance of the device will lower. On the other hand, if it is larger than 5 $\mu$m, the voltage to be applied to the device for driving it will increase. Accordingly, it is more desirable that the thickness of the light emission region falls between 10 nm and 3 $\mu$m, even more preferably between 20 nm and 1 $\mu$m.

(3) Electrodes

Anode Layer

For the anode layer, preferably used are metals, alloys and electroconductive compounds having a large work function (for example, at least 4.0 eV), or their mixtures. Concretely, one or more of indium tin oxide (ITO), indium copper, tin, zinc oxide, gold, platinum, palladium and the like can be used either singly or as combined.

The thickness of the anode layer is not specifically defined, but preferably falls between 10 and 1000 nm, more preferably between 10 and 200 nm.

It is desirable that the anode layer is substantially transparent, more concretely, having a transmittance of at least 10%, so that the light as emitted by the light emission region could be effectively taken out of the layer.

Cathode Layer

On the other hand; for the cathode layer, preferably used are metals, alloys, electroconductive compounds having a small work function (for example, smaller than 4.0 eV) or their mixtures. Concretely, one or more of magnesium, aluminium, indium, lithium, sodium, silver and the like can be used either singly or as combined.

The thickness of the cathode layer is not also specifically defined, but preferably falls between 10 and 1000 nm, more preferably between 10 and 200 nm.

(4) Others

Though not shown in FIG. 1, it is also desirable to provide a sealant layer that entirely covers the organic EL device for preventing penetration of water and oxygen into the device.

As preferred examples of the material for the sealant layer, mentioned are copolymers to be produced through copolymerization of a monomer mixture comprising tetrafluoroethylene and at least one comonomer; fluorine-containing copolymers having a cyclic structure in the copolymerized main chain; polyethylene, polypropylene, polymethyl methacrylate, polyimide, polyurea, polytetrafluoroethylene, polychlorotrifluoroethylene, polydichlorodifluoroethylene, or copolymers of chlorotrifluoroethylene and dichlorodifluoroethylene; water absorbent substances having a degree of absorption of at least 1%; moisture-proofing substances having a degree of absorption of at most 0.1%; metals such as In, Sn, Pb, Au, Cu, Ag, Al, Ti, Ni, etc.; metal oxides such as MgO, SiO, $SiO_2$, GeO, NiO, CaO, BaO, $Fe_2O$, $Y_2O_3$, $TiO_2$, etc.; metal fluorides such as $MgF_2$, LiF, $AlF_3$, $CaF_2$, etc.; liquid fluorocarbons such as perfluoroalkanes, perfluoroamines, perfluoropolyethers, etc.; compositions as prepared by dispersing an adsorbent capable of adsorbing water and oxygen in those liquid fluorocarbons; etc.

For forming the sealant layer, employable is any method of vaccum evaporation, spin coating, sputtering, casting, MBE (molecular beam epitaxial deposition), cluster ion beam vapor deposition, ion plating, plasma polymerization (high frequency-excited ion plating), reactive sputtering, plasma CVD, laser CVD, thermal CVD, gas source CVD or the like.

Second Embodiment

The second embodiment of the organic EL device of the invention is described. Like that of the first embodiment, the device of the second embodiment comprises an anode layer 10, a light emission region 12, an electron injection region 14 and a cathode layer 16 as laminated in that order on a substrate (not shown), as in FIG. 1.

However, being different from that in the first embodiment, the electron injection region 14 in the second embodiment comprises an electron-transporting compound and a reducing e dopant having a work function of at most 2.9 eV. Therefore, the electron-transporting compound and the reducing dopant having a work function of at most 2.9 eV to be in the region 14 are described in detail hereinunder. The other parts could be the same as those in the first embodiment or could be similar to those known in the art of ordinary organic EL devices.

Electron-Transporting Compound

As the electron-transporting compound to be in the electron injection region in the second embodiment, nitrogen-free aromatic compounds such as those employable in the first embodiment are employable, and, in addition, other organic compounds including nitrogen-containing aromatic compounds (these may be referred to as nitrogen-containing heterocyclic compounds) are also preferably employable.

Specifically, being different from that in the first embodiment, the reducing dopant to be used in the second embodiment has an increased degree of reducing ability. Therefore, in the second embodiment, compounds falling in a broad range are usable provided that they have the function of transferring the electrons having been injected from the cathode to the light emission region. In the second embodiment, even when nitrogen-containing heterocyclic compounds are used as the electron-transporting compound, they are effectively prevented from reacting with the material constituting the light emission region. As a result, the formation of charge-transfer complexes or exciplexes in the electron injection region is well prevented, whereby the luminance of the organic EL device is increased and the lifetime thereof is prolonged.

The nitrogen-containing heterocyclic compounds usable in the electron injection region are defined as compounds having a nitrogen-containing hetero ring structure. Concretely, they include nitrogen-containing complexes, and nitrogen-containing cyclic compounds. The nitrogen-containing complexes and the nitrogen-containing cyclic compounds have a high electron affinity of at least 2.7 eV, and a high degree of charge transfer capability of at least $10^{-6}$ $cm^2/V \cdot S$.

As preferred examples of the nitrogen-containing complexes, mentioned are metal complexes with a ligand of 8-quinolinol derivatives, such as tris (8-quinolinol)Al complex of the following formula (4), as well as tris(5,7-dichloro-8-quinolinol)Al complex, tris(5,7-dibromo-8-quinolinol)Al complex, tris(2-methyl-8-quinolinol)Al complex, tris(5-methyl-8-quinolinol)Al complex, tris (8-quinolinol) Zn complex, tris(8-quinolinol)In complex, tris(8-quinolinol)Mg complex, tris(8-quinolinol)Cu complex, tris(8-quinolinol)Ca complex, tris(8-quinolinol)Sn complex, tris(8-quinolinol)Ga complex, tris(8-quinolinol)Pb complex, etc. One or more of these may be used either singly or as combined.

Also preferred as the nitrogen-containing complexes are phthalocyanine derivatives, such as metal-free phthalocyanine, Cu phthalocyanine, Li phthalocyanine, Mg phthalocyanine, Pb phthalocyanine, Ti phthalocyanine, Ga phthalocyanine, CuO phthalocyanine, etc. One or more of these may be used either singly or as combined.

As preferred examples of the nitrogen-containing cyclic compounds, mentioned is at least one compound selected from the group consisting of oxadiazole derivatives, thiadiazole derivatives, triazole derivatives, quinoxaline derivatives and quinoline derivatives.

Of those, specific examples of the preferred oxadiazole derivatives are represented by the following formulae (5) and (6); one specific example of the preferred thiadiazole derivatives is by the following formula (7); that of the preferred triazole derivatives is by the following formula (8); that of the preferred quinoxaline derivatives is by the following formula (9); and that of the preferred quinoline derivatives is by the following formula (10).

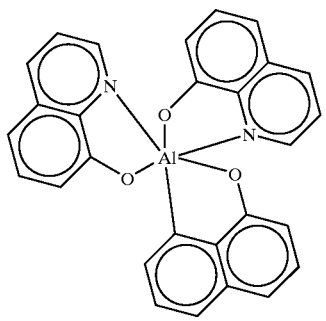

(4)

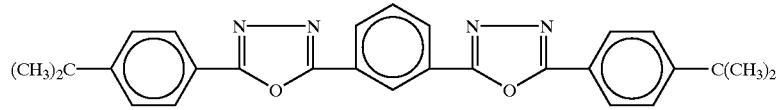

(5)

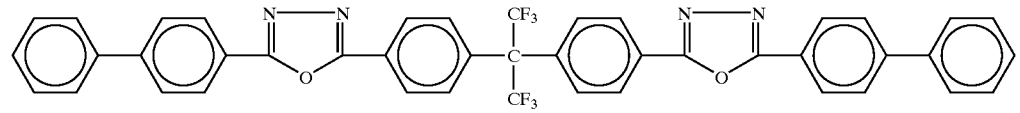

(6)

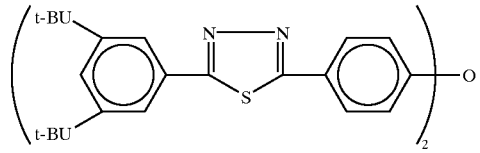

(7)

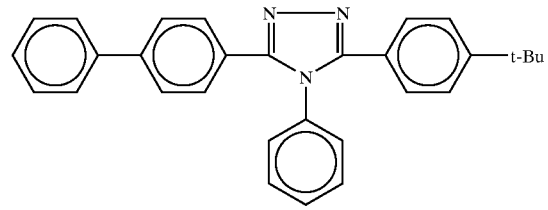

(8)

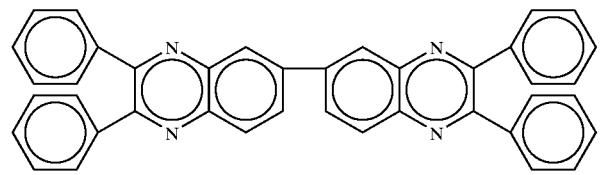

(9)

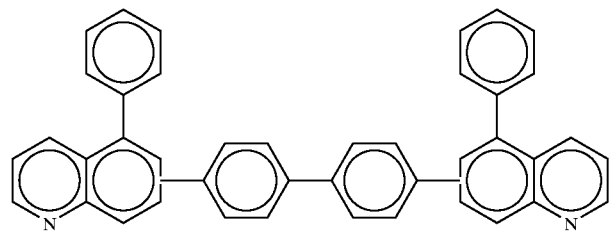

(10)

In addition, heterocyclic tetracarboxylic acid anhydrides of the following compound such as anthrone derivatives, fluorenylmethane derivatives, carbodiimide, naphthaleneperylene, etc.; as well as electron-transmitting compounds that are exemplified in JP-A-59-194393 as the material for light-emitting layer are also preferably used herein.

Reducing Dopant Having a Work Function of at Most 2.9 eV

The electron injection region in the second embodiment contains a reducing dopant having a work function of at most 2.9 eV. The reducing dopant having a work function of at most 2.9 eV is meant to indicate a substance which has a work function of at most 2.9 eV and which, even when the co-existing, electron-transporting compound is oxidized, can reduce the oxidized electron-transporting compound to a certain degree. Therefore, so far as it has a work function of at most 2.9 eV, the reducing dopant for the first embodiment which may be at least one substance selected from the group consisting of alkali metals, alkaline earth metals, rare earth metals, alkali metal oxides, alkali metal halides, alkaline earth metal oxides, alkaline earth metal halides, rare earth metal oxides and rare earth metal halides is favorably used herein.

More concretely, the preferred reducing dopant having a work function of at most 2.9 eV is at least one alkali metal selected from the group consisting of Na (having a work function of 2.36 eV), K (having a work function of 2.28 eV), Rb (having a work function of 2.16 eV) and Cs (having a work function of 1.95 eV), or at least one alkaline earth metal selected from the group consisting of Ca (having a work function of 2.9 eV), Sr (having a work function of from 2.0 to 2.5 eV) and Ba (having a work function of 2.52).

Of those, the reducing dopant is more preferably at least one alkali metal selected from the group consisting of K, Rb and Cs, even more preferably Rb or Cs, most preferably Cs. These alkali metals have an especially high degree of reducing ability. Therefore, even when a relatively small amount of the reducing dopant selected from them is in the electron injection region, the luminance of the organic EL device is much increased and the lifetime thereof is much prolonged.

As the reducing dopant having a work function of at most 2.9 eV, a combination of two or more of those alkali metals is also preferred. Especially preferred is a combination comprising Cs and one or two others. For example, the combination includes Cs and Na; Cs and K; Cs and Rb; and Cs, Na and K. Those combinations comprising Cs could exhibit much increased reducing ability. Therefore, with any of those combinations being in the electron injection region, the luminance of the organic EL device is still more increased and the lifetime thereof is still more prolonged.

The amount of the reducing dopant having a work function of at most 2.9 eV, which is to be in the electron injection region, is described. Like that in the first embodiment, the amount of the reducing dopant to be in the electron injection region in the second embodiment preferably falls between 0.1 and 50% by weight, more preferably between 1 and 20% by weight, relative to the sum total of the components constituting the region of being 100% by weight.

Regarding the amount of the reducing dopant having a work function of at most 2.9 eV that is to be in the electron injection region, it is desirable that the ratio of the electron-transporting compound to the reducing dopant falls between 1:20 and 20:1 (by mol). If the ratio of the electron-transporting compound to the reducing dopant falls outside the defined range, the luminance of the organic EL device will be lowered and the lifetime thereof will be shortened.

Accordingly, it is more desirable that the ratio of the electron-transporting compound to the reducing dopant falls between 1:10 and 10:1 (by mol), even more preferably between 1:5 and 5:1, most preferably between 1:3 and 3:1.

Electron Affinity

Like in the first embodiment, it is desirable that the electron affinity of the electron injection region in the second embodiment falls between 1.8 and 3.6 eV, more preferably between 1.9 and 3.0 eV, even more preferably between 2.0 and 2.5 eV. If the electron affinity oversteps the defined range, undesired complexes with low luminous efficiency will be readily formed and, in addition, it will be difficult to prevent the blocking contact from being formed at the interface between electron injection region and the light emission region.

The electron affinity of the electron injection region could be suitably controlled by changing the types of the electron-transporting compound and the reducing dopant that constitute the region and by changing the ratio of the two.

Also as in the first embodiment, it is still more desirable that the difference in the electron affinity between the electron injection region and the light emission region in the second embodiment is at most 0.5 eV, even more preferably at most 0.2 eV. In the organic EL device in which the electron affinity difference between the two regions is smaller, the electron transfer from the electron injection region to the light emission region is easier. With that constitution, therefore, the device ensures fast response.

Glass Transition Point

Like in the first embodiment, it is desirable that the glass transition point of the electron injection region in the second embodiment is 100° C. or higher, but more preferably falling between 105 and 200° C.

Third Embodiment

Figure 2:
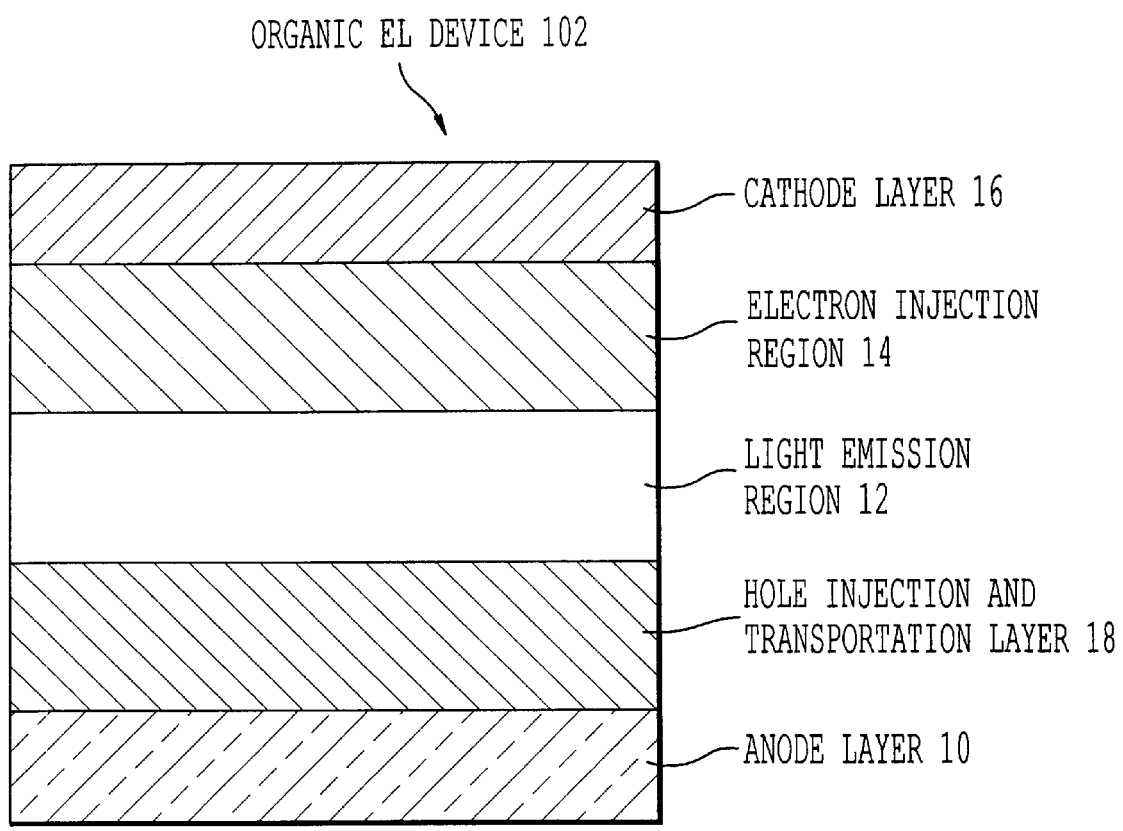
FIG. 2 is a cross-sectional view of an organic EL device of the third embodiment of the invention.

With reference to FIG. 2, the third embodiment of the invention is described. FIG. 2 is a cross-sectional view of an organic EL device 102 of the third embodiment, which comprises an anode layer 10, a hole injection and transportation layer 18, a light emission region 12, an electron injection region 14 and a cathode layer 16 as laminated in that order.

The organic EL device 102 is the same as the organic EL device 100 of the first and second embodiments, except that, in the former, the hole injection and transportation layer 18 is between the anode layer 10 and the light emission region 12.

Accordingly, the characteristic part of the hole injection and transportation layer 18 in the third embodiment is described in detail hereinunder, while the other parts, such as the electron injection region 14 and others could be the same as or similar to those in the first or second embodiment.

The hole injection and transportation layer 18 in the third embodiment has the function of smoothly receiving holes from the anode layer, substantially like an ordinary hole injection layer, and has an additional function of efficiently transporting the holes to the light emission region. Therefore, the hole injection and transportation layer 18 facilitates the injection and transportation of holes to the light emission region, thereby ensuring fast responsibility of the organic EL device.

The hole injection and transportation layer 18 is made of an organic or inorganic material. Preferred examples of the organic material are diamine compounds, diamine-containing oligomers and thiophene-containing oligomers. Preferred examples of the inorganic material are amorphous silicon (α-Si), α-SiC, microcrystalline silicon (μC-Si), μC-SiC, compounds of II–VI Groups, compounds of III–V Groups, amorphous carbon, crystalline carbon and diamond.

The structure of the hole injection and transportation layer 18 is not limited to only a single-layered one. For example, it may have any of a two-layered structure or a three-layered structure.

The thickness of the hole injection and transportation layer 18 is not also specifically defined. Preferably, however, it falls between 0.5 nm and 5 $\mu$m.

Fourth Embodiment

Figure 3:
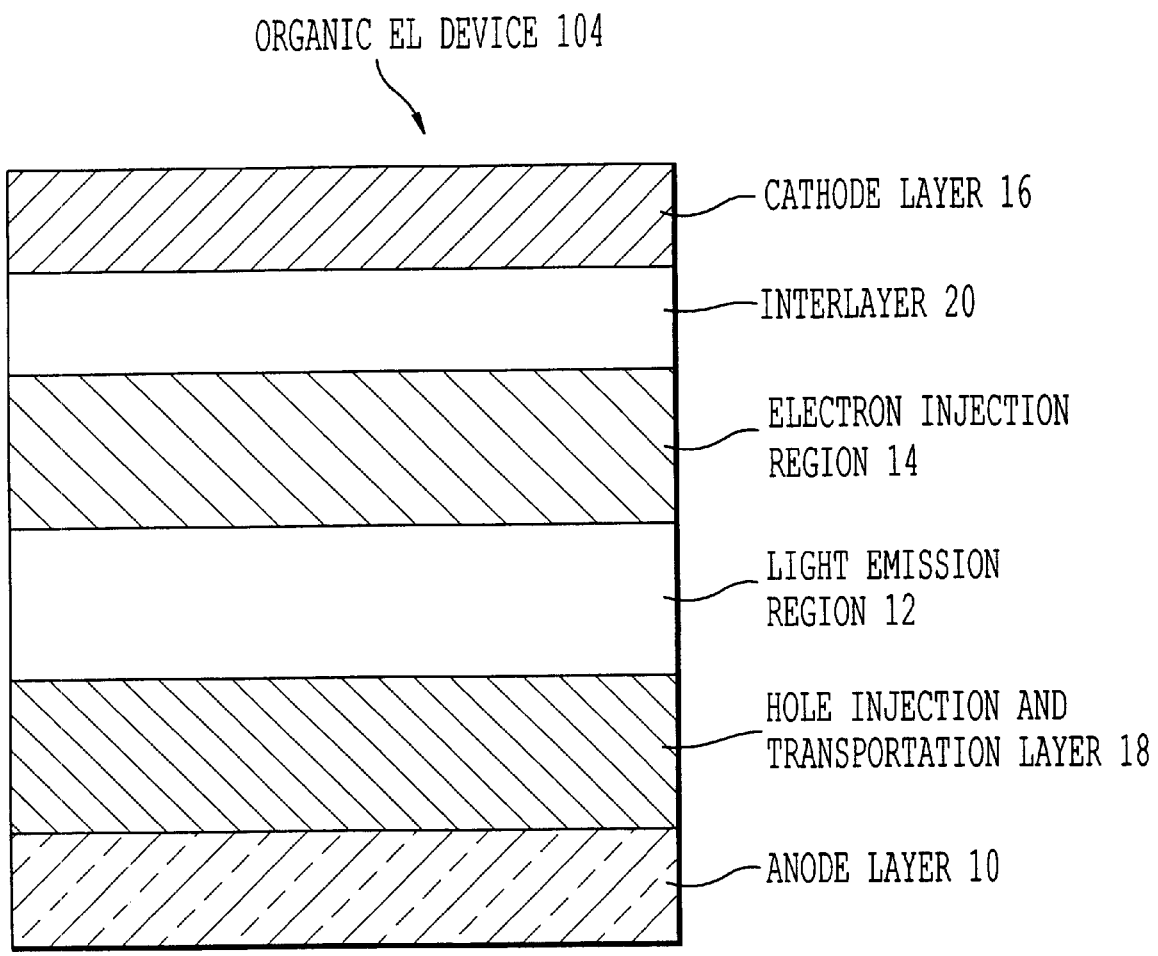
FIG. 3 is a cross-sectional view of an organic EL device of the fourth embodiment of the invention.

With reference to FIG. 3, the fourth embodiment of the invention is described. FIG. 3 is a cross-sectional view of an organic EL device 104 of the fourth embodiment, which comprises an anode layer 10, a hole injection and transportation layer 18, a light emission region 12, an electron injection region 14, a first interlayer 20 and a cathode layer 16 as laminated in that order.

The organic EL device 104 is the same as the organic EL device 102 of the third embodiment, except that, in the former, the first interlayer 20 is between electron injection region 14 and the cathode layer 16.

Accordingly, the characteristic part of the first interlayer 20 in the fourth embodiment is described in detail hereinunder. The other parts could be the same as or similar to those in the first to third embodiments, or for those, ordinary structures known in the art of organic EL devices shall apply thereto.

The first interlayer 20 in the fourth embodiment has the function of enhancing the electron injection into the light emission region. Therefore, the first interlayer 20 facilitates the injection and transportation of electrons to the light emission region, thereby ensuring fast responsibility of the organic EL device.

The first interlayer 20 is made of a material with electron injection capabilities. Preferred examples of the material are alkali metal compounds, alkaline earth metal compounds, alkali metal-containing amorphous substances, and alkali metal-containing microcrystalline substances.

More concretely, the alkali metal compounds include, for example, LiF, $Li_2O$, LiO and LiCl. Preferred examples of the alkaline earth metal compounds are BaO, SrO, MgO, $MgF_2$ and $SrCl_2$.

The structure of the first interlayer is not limited to only a single-layered one. For example, it may have any of a two-layered structure or a three-layered structure. The thickness of the first interlayer is not also specifically defined. Preferably, however, it falls between 0.1 nm and 10 $\mu$m.

Fifth Embodiment

Figure 4:
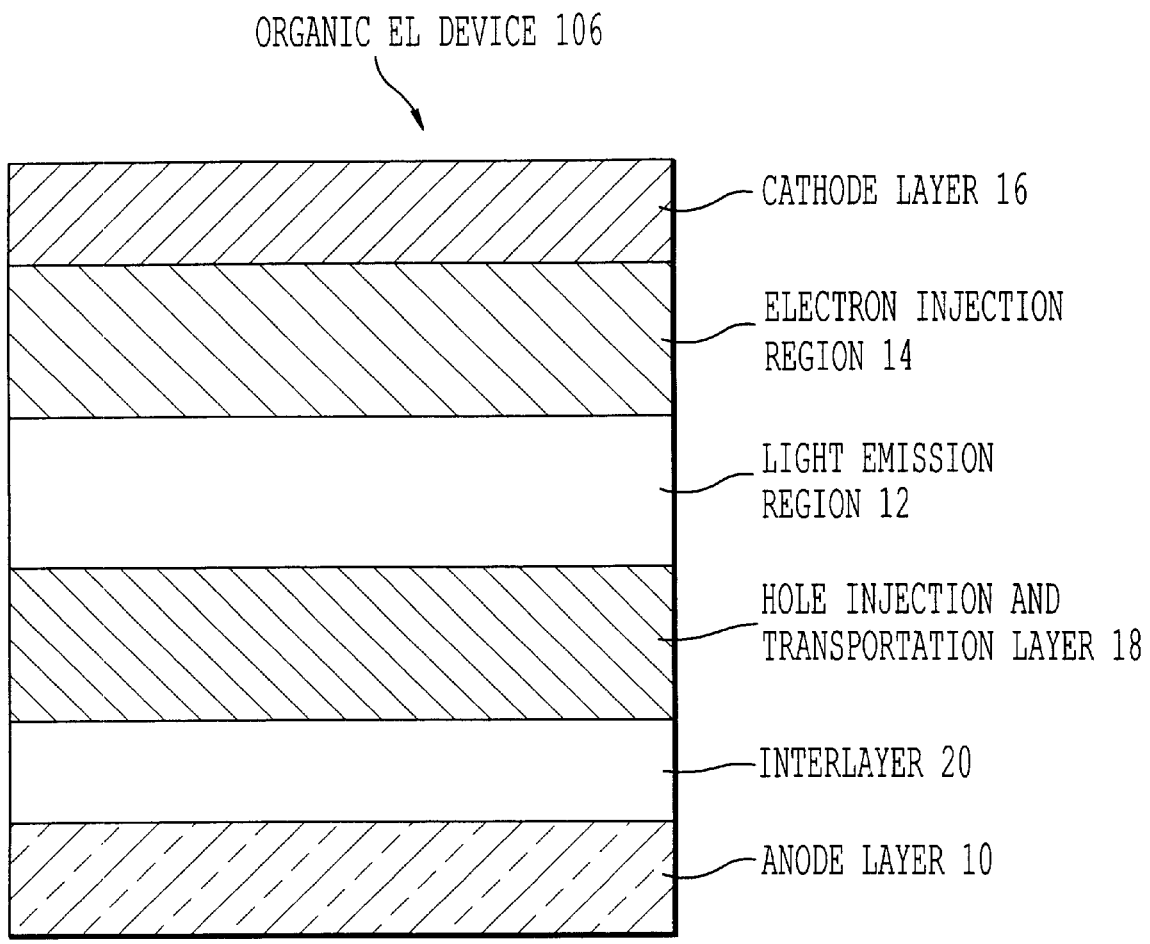
FIG. 4 is a cross-sectional view of an organic EL device of the fifth embodiment of the invention.

With reference to FIG. 4, the fifth embodiment of the invention is described. FIG. 4 is a cross-sectional view of an organic EL device 106 of the fifth embodiment, which comprises an anode layer 10, a second interlayer 24, a hole injection and transportation layer 18, a light emission region 12, an electron injection region 14 and a cathode layer 16 as laminated in that order.

The organic EL device 106 is the same as the organic EL device 102 of the third embodiment, except that, in the former, the second interlayer 24 is between the anode layer 10 and the hole injection and transportation layer 18. Accordingly, the characteristic part of the second interlayer 24 as provided between the anode layer 10 and the hole injection and transportation layer 18 in the fifth embodiment is described in detail hereinunder. The other parts could be the same as or similar to those in the first to fourth embodiments, or for those, ordinary structures known in the art of organic EL devices shall apply thereto.

The second interlayer 24 in the fifth embodiment has the function of enhancing the hole injection from the anode layer 10 into the light emission region. Therefore, the second interlayer 24 facilitates the injection and transportation of holes to the light emission region, thereby ensuring fast responsibility of the organic EL device.

As the material constituting the second interlayer, employable are any of polyaniline, amorphous carbon and phthalocyanines. The structure of the second interlayer is not limited to only a single-layered one. For example, it may have any of a two-layered structure or a three-layered structure. The thickness of the second interlayer is not also specifically defined. Preferably, however, it falls between 0.5 nm and 5 $\mu$m.

Sixth Embodiment

Figure 7:
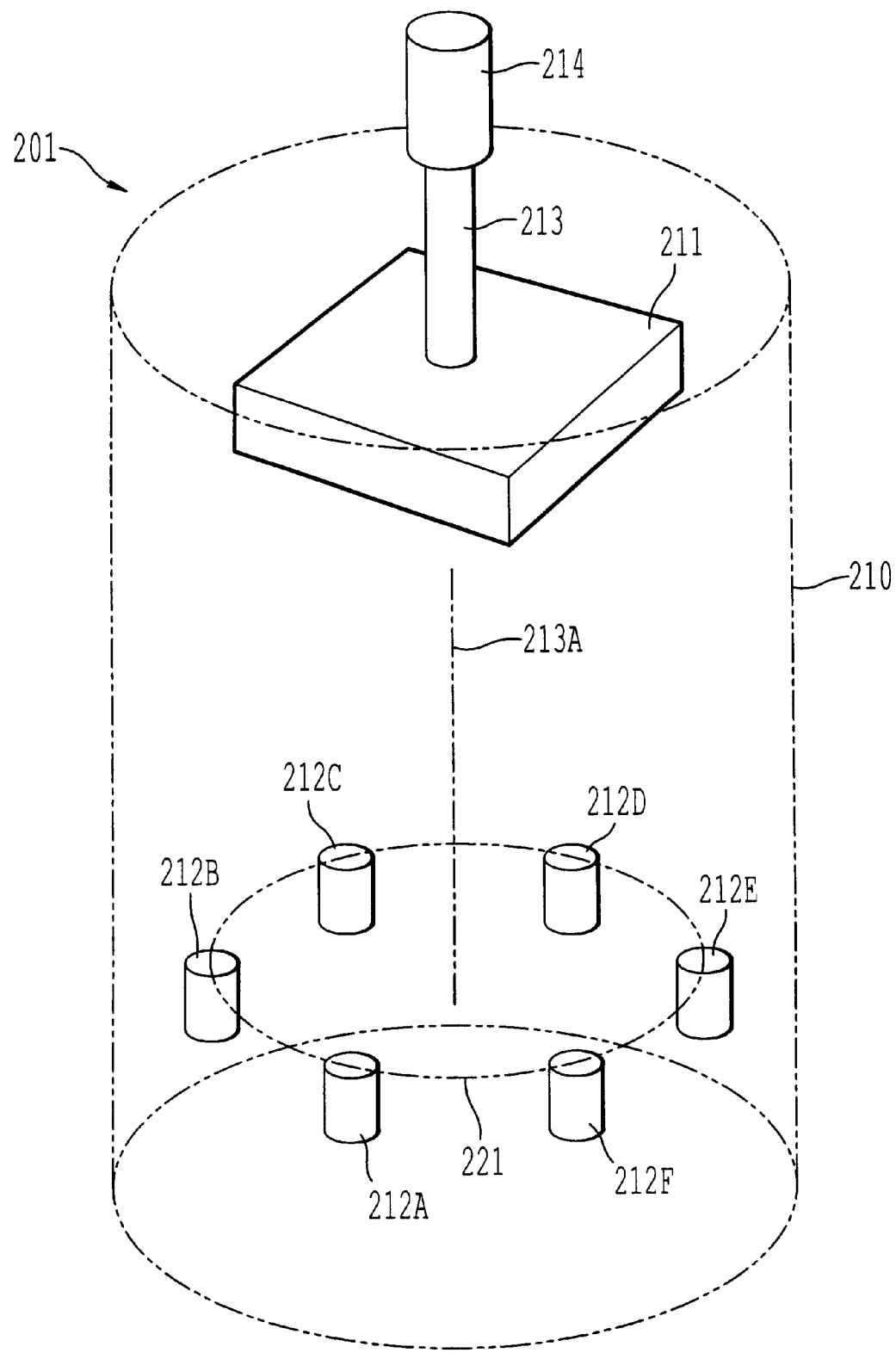
FIG. 7 is a perspective view of a vaccum evaporation apparatus for the sixth embodiment of the invention.
Figure 8:
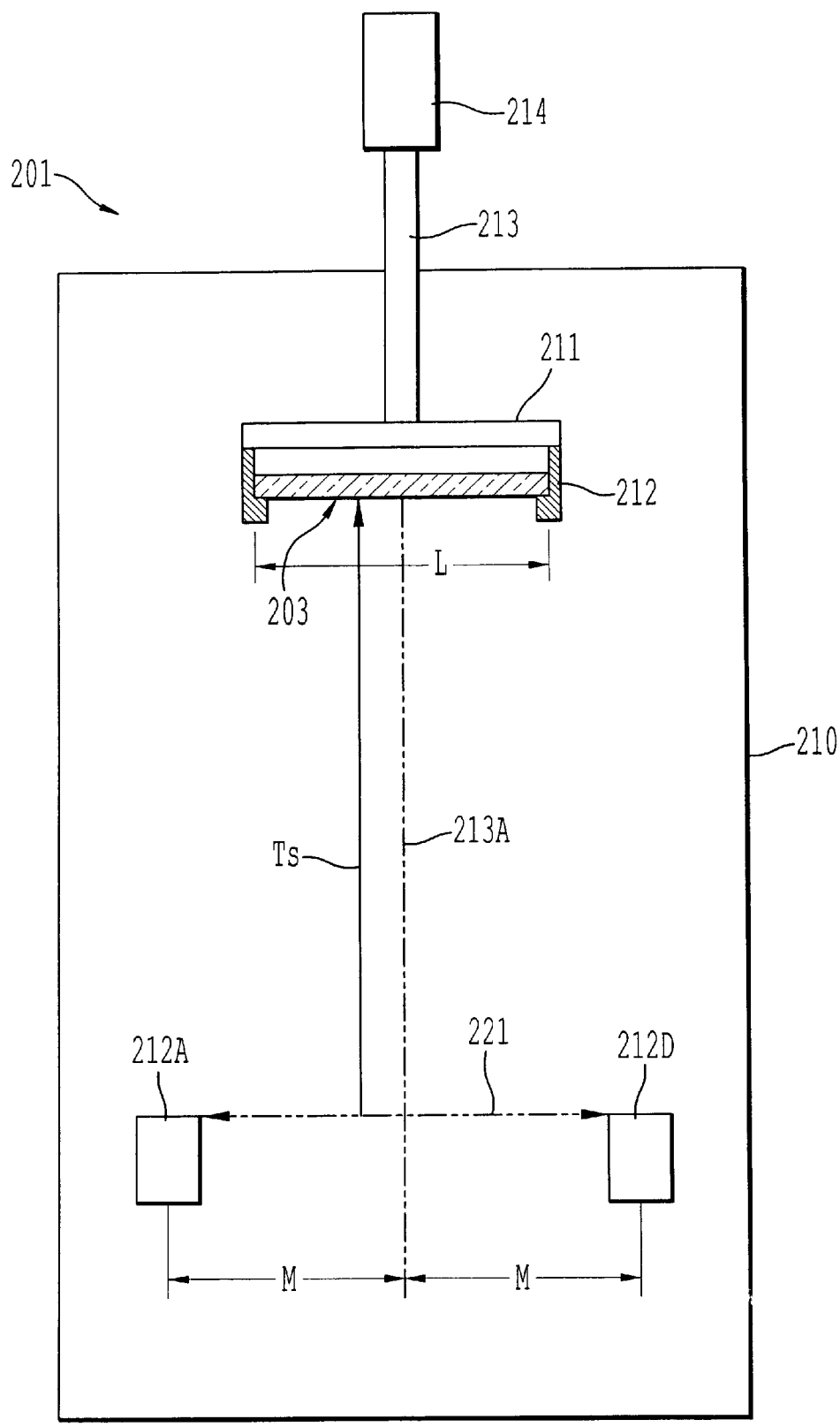
FIG. 8 is a cross-sectional view of the vaccum evaporation apparatus for the sixth embodiment of the invention.
Figure 9:
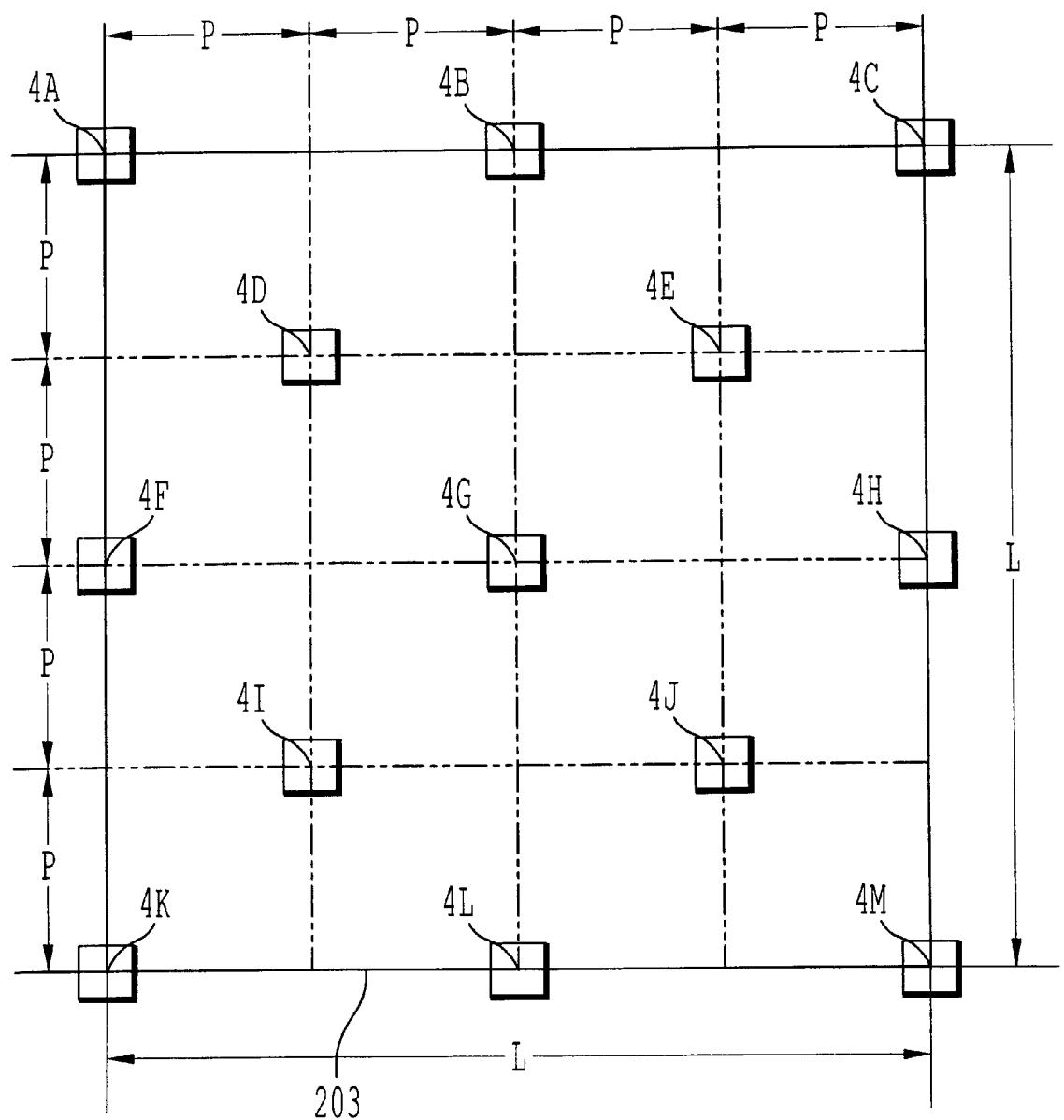
FIG. 9 is a schematic view showing the, points for measurement on a substrate.
Figure 10:
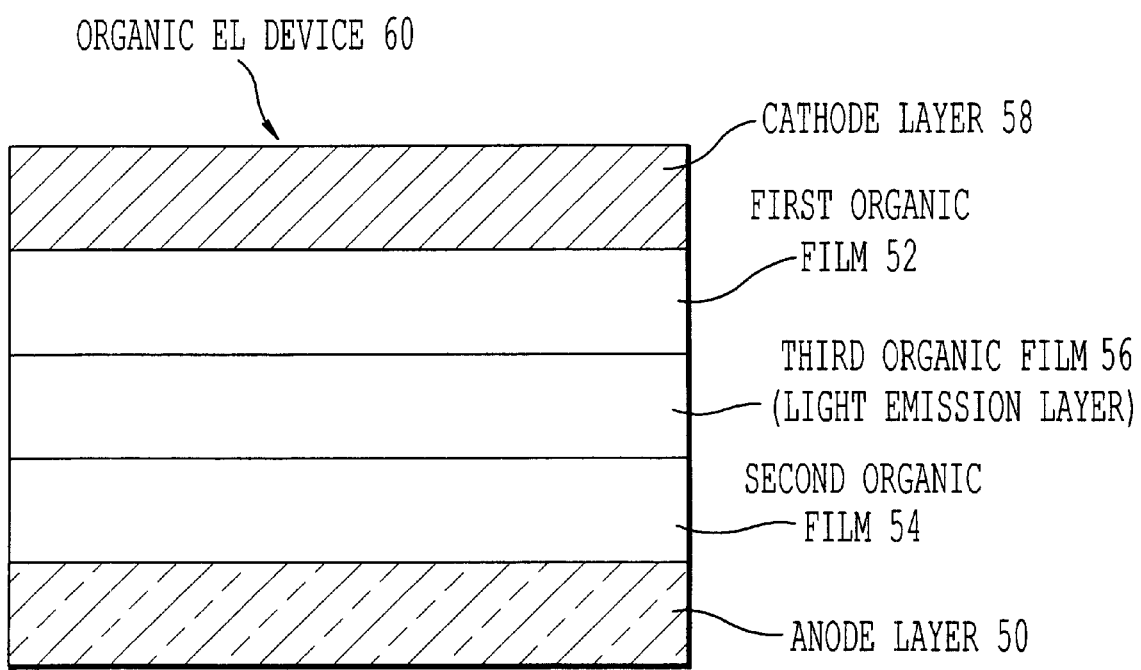
FIG. 10 is a cross-sectional view of a conventional organic EL device.

With reference to FIG. 7 to FIG. 9, the sixth embodiment of the invention is described. The sixth embodiment is to provide a method for fabricating organic EL devices, in which the compositional ratio of the materials constituting the electron injection region and others could be unified, even though the region and others have a large area, thereby reducing the fluctuation in the driving voltage for the devices and prolonging the lifetime of the devices. Another advantage of the method is that the space for the devices to be fabricated therein could be reduced.

Specifically, the method is for vapor deposition for forming thin films for organic EL devices. As one example, for this, used is a vaccum evaporation apparatus 201 as in FIG. 7 and FIG. 8. In the apparatus 201, different materials for deposition are vaporized all at a time from a plurality of vapor sources as put in their containers 212A to 212F that are disposed to face the substrate 203 therein. The vapors from those materials are deposited on the substrate 203 to form thin films thereon. Relative to the substrate 203, settled is a rotation axis line 213A around which the substrate 203 rotates on its own axis, and the vapor source containers 212A to 212F are all disposed below the substrate 203 while being spaced from the rotation axis line 213A of the substrate 203. In the apparatus, while the substrate 203 rotates on its own axis around the rotation axis line 213A, the vapors from the sources are deposited thereon.

The vaccum evaporation apparatus 201 of FIG. 7 and FIG. 8 comprises a vacuum chamber 210, a substrate holder 211 as disposed in the upper site of the vacuum chamber 210 to hold the substrate 203 with it, and a plurality of (six herein) vapor source containers 212A to 212F for different vapor sources all disposed below the substrate holder 211 while facing the substrate holder 211. The vacuum chamber 210 is kept in a predetermined vacuum condition by means of a degassing means (not shown). The number of the vapor source containers illustrated is 6, which, however, is not limitative. It may be 5 or less, or may even be 7 or more.

The substrate holder 211 is provided with a holding part 212 that supports the periphery of the substrate 203, and it holds the substrate 203 horizontally in the vacuum chamber 210. A rotary shaft 213 is vertically fitted to the upper surface of the substrate holder 211 at its center, and the substrate 203 rotates on its own axis around the rotary shaft 213. The rotary shaft 213 is connected with a rotational driving means of a motor 214. Owing to the rotational motion of the motor 214, the substrate 203 as held by the substrate holder 211 rotates, along with the substrate holder 211, on its own axis around the rotary shaft 213. Specifically, in this apparatus, the rotation axis line 213A of the rotary shaft 213 is settled in the vertical direction relative to the center of the substrate 203.

Now concretely described is the method for forming a film of the electron injection region 14 on the substrate 203 in the vaccum evaporation apparatus 201 having the constitution noted above First prepared is the substrate 203 of a flat plate having a square surface, and this is horizontally held by the substrate holder 211 while being clamped by the holding part 212, as in FIG. 7 and FIG. 8. FIG. 8 illustrates this condition, in which the part with hatching indicates the substrate 203 as horizontally held by the substrate holder 211.

To form the film of the electron injection region 14 in the apparatus illustrated, an electron-transporting compound and a reducing dopant are put separately in the two vapor source containers 212B and 212C that are adjacent to each other on the virtual circle 221, and then the vacuum chamber 210 is degassed through a degassing means to a predetermined vacuum degree of, for example, $1.0 \times 10^{-4}$ Pa.

Next, the vapor source containers 212B and 212C are heated so that the electron-transporting compound and the reducing dopant are simultaneously vaporized from the separate containers 212B and 212C, while, on the other hand, the motor 214 is rotationally driven so that the substrate 203 is rotated around the rotation axis line 213A at a predetermined speed of, for example, falling between 1 and 100 rpm. In that manner, while the substrate 203 is made to rotate on its own axis, the electron-transporting compound and the reducing dopant are co-deposited on the substrate to form thereon a film of the electron injection region 14.

In this stage, the vapor source containers 212B and 212C are both spaced from the rotation axis line 213A of the substrate 203 by a predetermined distance M in the horizontal direction, as in FIG. 8. Therefore, owing to the rotation of the substrate 203, the incident angle of the vapor stream of the electron-transporting compound and that of vapor stream of the reducing dopant relative to the substrate 203 could be regularly varied.

Accordingly, the vaporized materials could be uniformly deposited on the substrate 203, and the compositional ratio of the materials is unified in the film of the electron injection region 14 thus formed. For example, in the thin film formed in this method, the concentration unevenness could be surely reduced to ±10% (by mol).

The vapor deposition to be effected according to the method does not require any additional revolution of the substrate 203. Therefore, the space and the equipment for the additional revolution of the substrate 203 are unnecessary, and the filming can be economically attained in a minimized space. The additional revolution of the substrate as referred to herein is meant to indicate that the substrate is additionally rotated, except for its rotation on its own axis, around any other rotation axes. For this, needed is a broader space than that needed for the case illustrated herein where the substrate is made to rotate on its own axis only.

In the method of the sixth embodiment, the shape of the substrate 203 is not specifically defined. However, it is desirable that the substrate 203 is of a rectangular tabular shape, for example, as in FIG. 7 and FIG. 8. In the illustrated case, it is also desirable that a plurality of vapor source containers 212A to 212E are disposed along the circumference of the virtual circle 221 as drawn around the rotation axis line 213A of the substrate 203 as its center so as to satisfy the condition of M>½×L where M indicates the radius of the virtual circle 221 and L indicates the length of one side of the substrate 203. Where all the sides of the substrate 203 are not the same but differ, L shall indicates the longest side thereof.

With that constitution, the incident angles of the vapor streams of different vaporizing materials running out of the plural vapor source containers 212A to 212E toward the substrate 203 could be all the same relative to the substrate 203, and therefore, the compositional ratio of the materials deposited on the substrate 203 is more easy to control.

With that constitution, in addition, the materials are vaporized and run toward the substrate 203 at a predetermined incident angle relative to the substrate 203, but not vertically thereto. Therefore, the uniformity of the compositional ratio in the film deposited on the substrate 203 could be much more increased.

In the method of the sixth embodiment, where a plurality of vapor source containers 212A to 212E are disposed on the circumference of the virtual circle 221 as drawn around the rotation axis line 213A of the substrate 203 as its center, as in FIG. 7, and where a mixture phase zone of two or more materials (e.g., the electron-transporting compound and the reducing dopant as in the case illustrated herein) is intended to be formed in a uniform compositional ratio, it is desirable that the vapor source-containers for those materials are positioned to be adjacent to each other. As opposed to this, however, where the compositional ratio of the materials deposited on the substrate is intended to vary in the direction of the thickness of the deposited film, it is desirable that the vapor source containers for those materials are positioned to be remote from each other. For example, when the number of the vapor sources is represented by "n", the vapor source containers may be disposed at an angle of 360°/n to each other relative to the center of the circle.

The uniformity of the thin film layers to be formed according to the method of the sixth embodiment is described in detail. In one example, Alq was used as the electron-transporting compound and Cs was as the reducing dopant, and a glass substrate 203 shown in FIG. 9 was coated with a thin film layer of those substances having a thickness of about 1000 Å (defined value), while being rotated at 5 rpm. For this, the two substances were vaporized simultaneously for co-deposition, under the condition mentioned below.

Deposition rate of Alq: 0.2 nm/sec.

Deposition rate of Cs: 0.03 nm/sec.

Thickness of Alq/Cs: 1000 Å (defined value).

Using a profilometer, the thickness of the thus-formed thin film was measured at different points (4 A to 4 M) on the glass substrate 203, as in FIG. 9. In addition, the compositional ratio of Cs/Al in the film was measured through electron spectroscopy for chemical analysis (ESCA) using an X-ray photoelectron spectrometer. In FIG. 9, the points for measurement (4 A to 4 M) on the glass substrate 203 were settled as follows: The surface of the substrate 203 was divided into 16 equal square sections, each having one side, P, of being 50 mm long, and any desired corners of those sections were selected for the points (13 in all) .The data obtained are shown in Table 1.

TABLE 1

| Point for Measurement | Thickness (Å) | Cs/Al (-) |
|---|---|---|
| 4A | 1053 | 1.0 |
| 4B | 1035 | 1.0 |
| 4C | 1047 | 1.0 |
| 4D | 1088 | 1.1 |
| 4E | 1091 | 1.0 |
| 4F | 1093 | 1.1 |
| 4G | 1082 | 1.1 |
| 4H | 1075 | 1.0 |
| 4I | 1082 | 1.1 |
| 4J | 1065 | 1.1 |
| 4K | 1010 | 1.0 |
| 4L | 1008 | 1.0 |
| 4M | 1025 | 1.0 |

In another example, a thin film having a thickness of about 1000 Å (defined value) was formed in the same manner as above for the method of the sixth embodiment. In this, however, the substrate 203 was not rotated. The condition for deposition was the same as above. The thickness of the thin film formed and the compositional ratio of Cs/Al in the film were measured at different points (4 A to 4 M), in the same manner as above. The data obtained are shown in Table 2.

TABLE 2

| Point for Measurement | Thickness (Å) | Cs/Al (−) |
|---|---|---|
| 4A | 895 | 0.6 |
| 4B | 941 | 1.1 |
| 4C | 884 | 1.1 |
| 4D | 911 | 0.7 |
| 4E | 922 | 1.1 |
| 4F | 1022 | 0.8 |
| 4G | 919 | 1.2 |
| 4H | 1015 | 1.3 |
| 4I | 1067 | 0.7 |
| 4J | 908 | 1.2 |
| 4K | 895 | 0.5 |
| 4L | 920 | 1.0 |
| 4M | 950 | 1.1 |

As is obvious from those data, it is known that the thin film as formed according to the method of the sixth embodiment is highly uniform in its thickness that falls within the scope between 1008 and 1091 Å at all points (4 A to 4 M) on the substrate 203 and in its compositional ratio of Cs/Al (by mol) that falls within the scope between 1.0 and 1.10 (−) at those points.

Contrary to this, it is known that the thin film as formed according to the method which differs from the method of the sixth embodiment is not uniform in its thickness that varies in a wide scope between 884 and 1067 Å at the points (4 A to 4 M) on the substrate 203 and in its compositional ratio of Cs/Al (by mol) that varies also in a wide scope between 0.6 and 1.2 (−) at those points.

Some specific embodiments of the invention have been described hereinabove, but these are not intended to restrict the scope of the invention. The embodiments illustrated herein could be modified and changed indifferent manners. For example, in the embodiments, the light emission region and the electron injection region are provided separately, but are not limitative. In the invention, the light emission region and the electron injection region may be combined in one layer, if desired. In addition, any optional layers could be provided between the cathode layer and the anode layer.

The invention is described in more detail with reference to the following Examples, which, needless-to-say, are not intended to restrict the scope of the invention.

EXAMPLE 1

Figure 5:
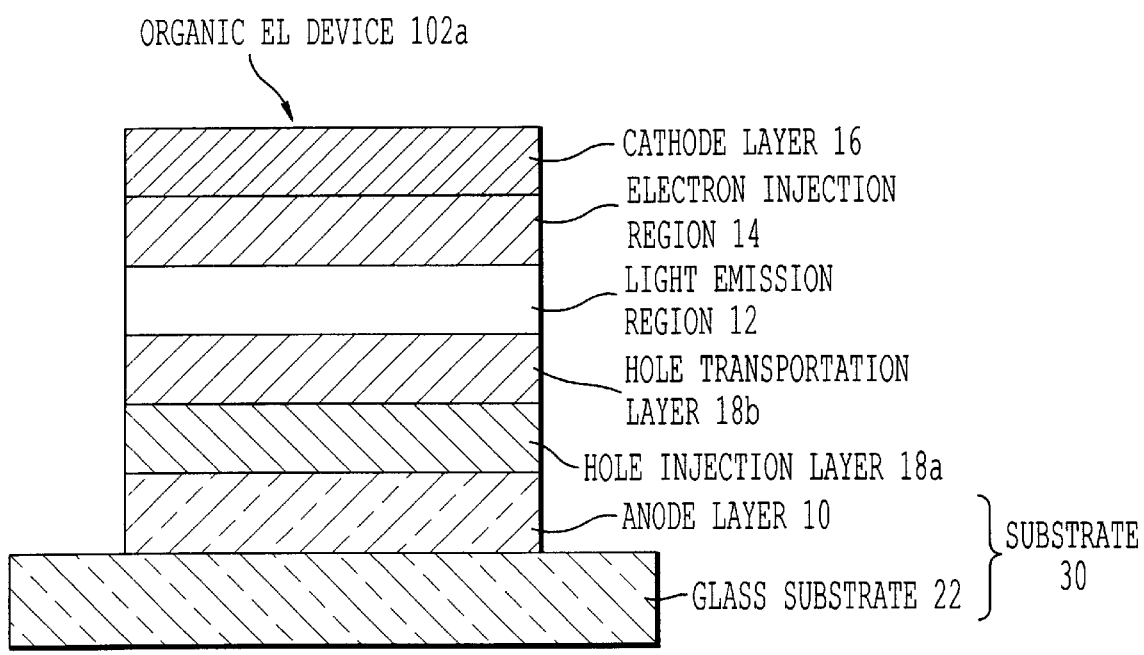
FIG. 5 is a cross-sectional view of an organic EL device of Example 1.

FIG. 5, FIG. 7 and FIG. 8 are referred to for Example 1 of the invention. The structure of the organic EL device 102a of Example 1 as illustrated in FIG. 5 corresponds to the organic EL device 102 of the third embodiment illustrated in FIG. 2. However, the organic EL device 102a of Example 1 differs from the organic EL device 102 of the third embodiment in that, in the former, the hole injection and transportation layer 18 is composed of two layers, a hole injection layer 18a and a hole transportation layer 18b, as laminated in that order.

(1) Preparation for Fabrication of Organic EL Device

In fabricating the organic EL device 102a of Example 1, a transparent electrode film of ITO was formed, as the anode layer 10, on a glass substrate 22 having a thickness of 1.1 mm, a length of 200 mm and a width of 200 mm. A combination of the glass substrate 22 and the anode layer 10 is referred to as a substrate 30 (this is designated as 203 in FIG. 7 and FIG. 8). Next, the substrate 30 was ultrasonically cleaned with isopropyl alcohol, then dried in an $N_2$ (nitrogen gas) atmosphere, and thereafter washed with UV (ultraviolet rays) and ozone for 10 minutes.

Next, the substrate 30 was fitted to the substrate holder 211 in the vacuum chamber 210 of the vaccum evaporation apparatus 201, as in FIG. 8; while a hole-injecting organic substance (HI-1) for forming the hole injection layer 18a was put in the vapor source container 212A, a hole-injecting and transporting organic substance (HT-1) for forming the hole transportation layer 18b was in the vapor source container 212B, a nitrogen-free aromatic compound (EM-1) for forming the electron injection region and the light emission region was in the vapor source container 212C, a reducing dopant (Li) for forming the electron injection region was in the vapor source container 212D, and a metal (Al) for forming the cathode layer was in the vapor source container 212E.

HI-1 is represented by the following structural formula (11); HT-1 is by the following structural formula (12); and EM-1 is by the following structural formula (13). EM has a glass transition point of 105° C., and the electron affinity of the electron injection region containing it was 2.8 eV.

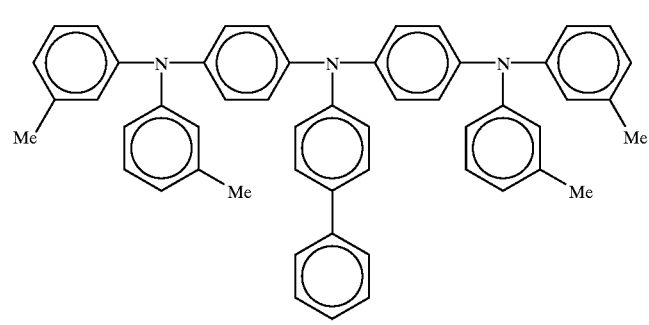

(11)

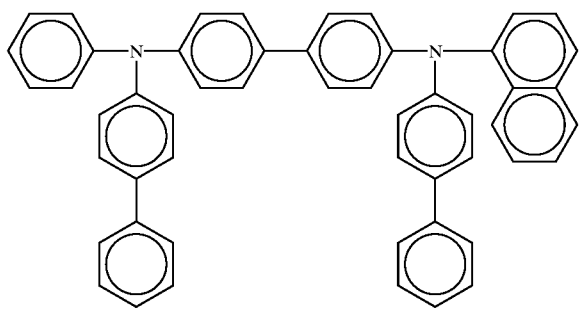

(12)

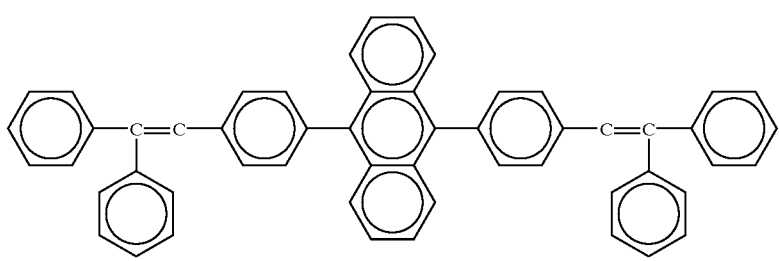

(13)

(2) Fabrication of organic EL device

Next, the vacuum chamber 210 was degassed to a vacuum degree of $5 \times 10^{-5}$ Pa or lower. In that condition, the hole injection layer 18a, the hole transportation layer 18b, the light emission region 12, the electron injection region 14 and the cathode layer 16 were deposited in that order on the anode layer 10 of the substrate 30 to fabricate the organic EL device 102a. Throughout the process from the formation of the hole injection layer 18a to the formation of the cathode layer 16, the vacuum condition in the chamber was not broken at all, and the organic EL device 102a was thus fabricated in the continuous vacuum condition.

More concretely, HI-1 in the vapor source container 212A was vaporized and deposited on the anode layer 10 to form thereon the hole injection layer 18a; and then, HT-1 in the vapor source container 212B was vaporized and deposited on the hole injection layer 18a to form thereon the hole transportation layer 18b. The deposition condition is shown below. During the deposition, the substrate 30 was neither heated nor cooled.

Deposition rate of HI-1: 0.1 to 0.3 nm/sec.
Thickness of HI-1 film: 60 nm.
Deposition rate of HT-1: 0.1 to 0.3 nm/sec.
Thickness of HT-1 film: 20 nm.

Next, the organic light-emitting material, EM-1 in the vapor source container 212C was vaporized and deposited on the hole transportation layer 18b to form thereon the organic light emission region 12, in the same manner as in the formation of the hole injection layer 18a. The deposition condition for it is as follows:

Deposition rate of EM-1: 0.1 to 0.3 nm/sec.
Thickness of EM-1 film: 40 nm.

Next, EM-1 and Li in the vapor source containers 212C and 212D, respectively, were simultaneously vaporized and deposited on the organic light emission region 12 to form thereon the electron injection region 14, for which the deposition condition is as follows:

Deposition rate of EM-1: 0.1 to 0.3 nm/sec.
Deposition rate of Li: 0.05 to 0.01 nm/sec.
Thickness of EM-1/Li film: 20 nm.

For the co-deposition, herein employed was the method of the sixth embodiment. Precisely, the vapor source containers 212C and 212D were spaced from the rotation axis line 213A of the substrate 30 (203) by 30 mm in the horizontal direction. In that condition, the vapor source containers 212C and 212D were heated so that EM-1 and Li in those were simultaneously vaporized, while the substrate 203 was made to rotate on its own axis at 5 rpm around the rotation axis line 213A, by rotationally driving the motor 214, thereby forming a film of the electron injection region 14.

Finally, Al in the vapor source container 212E was vaporized and deposited on the electron injection region 14 to form thereon the cathode layer 16, for which the deposition condition is as follows:

Deposition rate of Al: 1 nm/sec.
Thickness of Al film: 200 nm.

(3) Evaluation of Organic EL Device

To the organic EL device 102a thus fabricated, applied was a direct-current voltage of 7 V between the cathode layer 16 of being a minus (−) electrode and the anode layer 10 of being a plus (+) electrode. As shown in Table 3 below, the current density was 1.0 mA/cm$^2$, the luminance was 40 cd/m$^2$, and the emitted light was blue.

The half lifetime of the device 102a was 1000 hours. The half lifetime as referred to herein is meant to indicate the time taken by the device before its luminance is attenuated to a half of its maximum luminance. For example, for the device of Example 1, its maximum luminance is 40 cd/m$^2$. Therefore, the time taken by the device before its luminance is attenuated to a half of its maximum luminance, 20 cd/m$^2$, indicates the half lifetime of the device. The data of the device obtained herein are shown in Table 3.

TABLE 3

| Example | Light Emission Region | Electron Injection Region | | Current Density (mA/cm$^2$) | Luminance (cd/m$^2$) | Electron Affinity (eV) | Half lifetime (hrs) |
|---|---|---|---|---|---|---|---|
| | | Material | Molar Ratio | | | | |
| 1 | EM-1 | EM-1/Li | 1/1 | 1 | 40 | 2.8 | 1000 |
| 2 | EM-1 | EM-1/Ca | 1/1 | 1.2 | 50 | 2.8 | 1500 |
| 3 | EM-1 | EM-1/Na | 1/1 | 1 | 60 | 2.8 | 1600 |
| 4 | EM-1 | EM-1/K | 1/1.3 | 4 | 146 | 2.2 | 1800 |
| 5 | EM-1 | EM-1/Cs | 1/1 | 40 | 1000 | 2.0 | 2500 |
| 6 | EM-1 | EM-1/Cs | 1/1.5 | 38 | 1300 | 2.0 | 3000 |
| 7 | EM-1 | EM-1/Cs | 1/4.0 | 25 | 1100 | 2.0 | 1700 |
| 8 | EM-1 | EM-1/Cs/Na | 1/1/0.5 | 40 | 1000 | 2.0 | 2500 |
| 9 | EM-1 | DFAD/Li | 1/1 | 1.5 | 60 | 2.8 | 1800 |
| 10 | EM-1 | Alq/Cs | 1/1 | 25 | 500 | 2.0 | 2500 |
| 11 | Alq | Alq/Na | 2/1 | 3 | 200 | 2.3 | 3000 |
| 12 | EM-1 | H1/CS | 1/1 | 5 | 700 | 2.5 | 1000 |
| 13 | EM-1 | H2/Sr | 1/1 | 1.5 | 200 | 2.6 | 2000 |

EXAMPLE 2

Example 2 of the invention is described. The structure of the organic EL device of Example 2 is the same as that of the organic EL device 102a of Example 1, and was fabricated in the same manner as in Example 1. In Example 2, however, a metal of Ca (calcium) was used as the reducing dopant to be in the electron injection region, in place of the Li metal in Example 1.

As in Example 1, a direct-current voltage of 7 V was applied to the organic EL device fabricated herein. As shown in Table 3 above, the current density of the device of Example 2 was 1.2 mA/cm$^2$, the luminance thereof was 50 cd/m$^2$, and the half lifetime thereof was 1500 hours. The data obtained are all in Table 3.

EXAMPLE 3

Example 3 of the invention is described. The structure of the organic EL device of Example 3 is the same as that of the organic EL device 102a of Example 1, and was fabricated in the same manner as in Example 1. In Example 3, however, a metal of Na (sodium) was used as the reducing dopant to be in the electron injection region, in place of the Li metal in Example 1.

As in Example 1, a direct-current voltage of 7 V was applied to the organic EL device fabricated herein. As shown in Table 3 above, the current density of the device of Example 3 was 1.0 mA/cm$^2$, the luminance thereof was 60 cd/m$^2$, and the half lifetime thereof was 1600 hours. The data obtained are all in Table 3.

EXAMPLE 4

Example 4 of the invention is described. The structure of the organic EL device of Example 4 is the same as that of the organic EL device 102a of Example 1, and was fabricated in the same manner as in Example 1. In Example 4, however, a metal of K (potassium) was used in an amount of 1.3 mols relative to one mol of EM-1, as the reducing dopant to be in the electron injection region, in place of the Li metal in Example 1.

As in Example 1, a direct-current voltage of 7 V was applied to the organic EL device fabricated herein. As shown in Table 3 above, the current density of the device of Example 4 was 4.0 mA/cm$^2$, the luminance thereof was 146 cd/m$^2$, and the half lifetime thereof was 1800 hours. The data obtained are all in Table 3.

EXAMPLES 5 to 7

Examples 5 to 7 of the invention are described. The structure of the organic EL devices of Examples 5 to 7 is the same as that of the organic EL device 102a of Example 1, and were fabricated in the same manner as in Example 1. In Examples 5 to 7, however, a metal of Cs (cesium) was used in an amount of 1 mol (Example 5), 1.5 mols (Example 6) and 4.0 mols (Example 7) relative to one mol of EM-1, as the reducing dopant to be in the electron injection region, in place of the Li metal in Example 1.

As in Example 1, a direct-current voltage of 7 V was applied to each organic EL device fabricated herein. The current density was 40 mA/cm$^2$ in Example 5, 38 mA/cm$^2$ in Example 6 and 25 mA/cm$^2$ in Example 7. The data obtained herein will mean that the devices having a smaller amount of Cs added thereto could produce a relatively higher current density in some degree.

The luminance of the devices was 1000 cd/m$^2$ in Example 5, 1300 cd/m$^2$ in Example 6, and 1100 cd/m$^2$ in Example 7.

The half lifetime of the devices was 2500 hours in Example 5, 3000 hours in Example 6, and 1700 hours in Example 7.

EXAMPLE 8

Example 8 of the invention is described. The structure of the organic EL device of Example 8 is the same as that of the organic EL device 102a of Example 1, and was fabricated in the same manner as in Example 1. In Example 8, however, a mixture of Cs and Na (1.0 mol of Cs and 0.5 mols of Na, relative to 1 mol of EM-1) was used as the reducing dopant to be in the electron injection region, in place of the Li metal in Example 1.

As in Example 1, a direct-current voltage of 7 V was applied to the organic EL device fabricated herein. The current density of the device of Example 9 was 4.0 mA/cm$^2$, the luminance thereof was 1000 cd/m$^2$, and the half lifetime thereof was 2500 hours. The data obtained are all in Table 3.

EXAMPLE 9

Example 9 of the invention is described. The structure of the organic EL device of Example 9 is the same as that of the organic EL device of Example 1. In Example 9, however, diphenylanthracene dimer (DFAD) of the following formula (14) was used as the material for the electron injection region, in place of EM-1 in Example 1. The glass transition point of the electron injection region in this Example was measured through DSC, and was 120° C. In this Example, the other layers except the electron injection region were all the same in their materials and thickness as in Example 1.

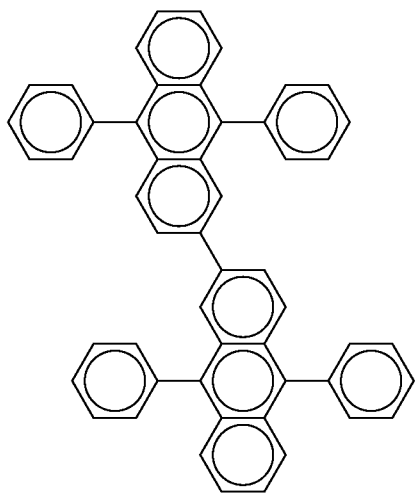

(14)

As in Example 1, a direct-current voltage of 7 V was applied to the organic EL device fabricated herein. The current density of the device of Example 9 was 1.5 mA/cm$^2$, the luminance thereof was 60 cd/m$^2$, and the half lifetime thereof was 1800 hours. The data obtained are all in Table 3.

EXAMPLE 10

Example 10 of the invention is described. The structure of the organic EL device of Example 10 is the same as that of the organic EL device of Example 1. In Example 10, however, Alq of formula (4) was used as the material for the electron injection region, in place of EM-1, a metal of Cs (cesium) was used as the reducing dopant in place of Li, and the ratio of Cs to Alq was 1/1 (by mol). The glass transition point of the electron injection region in this Example was measured through DSC, and was 180° C. In this Example, the other layers except the electron injection region were all the same in their materials and thickness as in Example 1.

As in Example 1, a direct-current voltage of 7 V was applied to the organic EL device fabricated herein. The current density of the device of Example 10 was 25 mA/cm$^2$, the luminance thereof was 500 cd/m$^2$, and the half lifetime thereof was 2500 hours. The data obtained are all in Table 3.

EXAMPLE 11

Example 11 of the invention is described. The structure of the organic EL device of Example 11 is the same as that of the organic EL device of Example 1. In Example 11, however, Alq of formula (4) was used as the material for the electron injection region, in place of EM-1, a metal of Na (sodium) was used as the reducing dopant in place of Li, and the ratio of Na to Alq was 0.5/1 (by mol). In this Example, the other layers except the electron injection region were all the same in their materials and thickness as in Example 1.

As in Example 1, a direct-current voltage of 7 V was applied to the organic EL device fabricated herein. The current density of the device of Example 11 was 3 mA/cm$^2$, the luminance thereof was 200 cd/m$^2$, and the half lifetime thereof was 3000 hours. The data obtained are all in Table 3.

EXAMPLE 12

Example 12 of the invention is described. The structure of the organic EL device of Example 12 is the same as that of the organic EL device of Example 1. In Example 12, however, a quinoxaline compound (H1) of formula (9) was used as the material for the electron injection region, in place of EM-1, a metal of Cs was used as the reducing dopant in place of Li, and the ratio of Cs to H1 was 1/1 (by mol). The glass transition point of the electron injection region in this Example was measured through DSC, and was 103° C. In this Example, the other layers except the electron injection region were all the same in their materials and thickness as in Example 1.

As in Example 1, a direct-current voltage of 7 V was applied to the organic EL device fabricated herein. The current density of the device of Example 12 was 5 mA/cm$^2$, the luminance thereof was 700 cd/m$^2$, and the half lifetime thereof was 1000 hours. The data obtained are all in Table 3.

EXAMPLE 13

Example 13 of the invention is described. The structure of the organic EL device of Example 13 is the same as that of the organic EL device of Example 1. In Example 13, however, an oxadiazole compound (H2) of the following formula (15) was used as the material for the electron injection region, in place of EM-1, a metal of Sr was used as the reducing dopant in place of Li, and the ratio of Sr to H2 was 1/1 (by mol). The glass transition point of the electron injection region in this Example was measured through DSC, and was 101° C. In this Example, the other layers except the electron injection region were all the same in their materials and thickness as in Example 1.

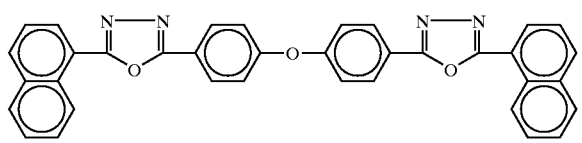

(15)

As in Example 1, a direct-current voltage of 7 V was applied to the organic EL device fabricated herein. The current density of the device of Example 13 was 1.5 mA/cm$^2$, the luminance thereof was 200 cd/m$^2$, and the half lifetime thereof was 2000 hours. The data obtained are all in Table 3.

EXAMPLE 14

Figure 6:
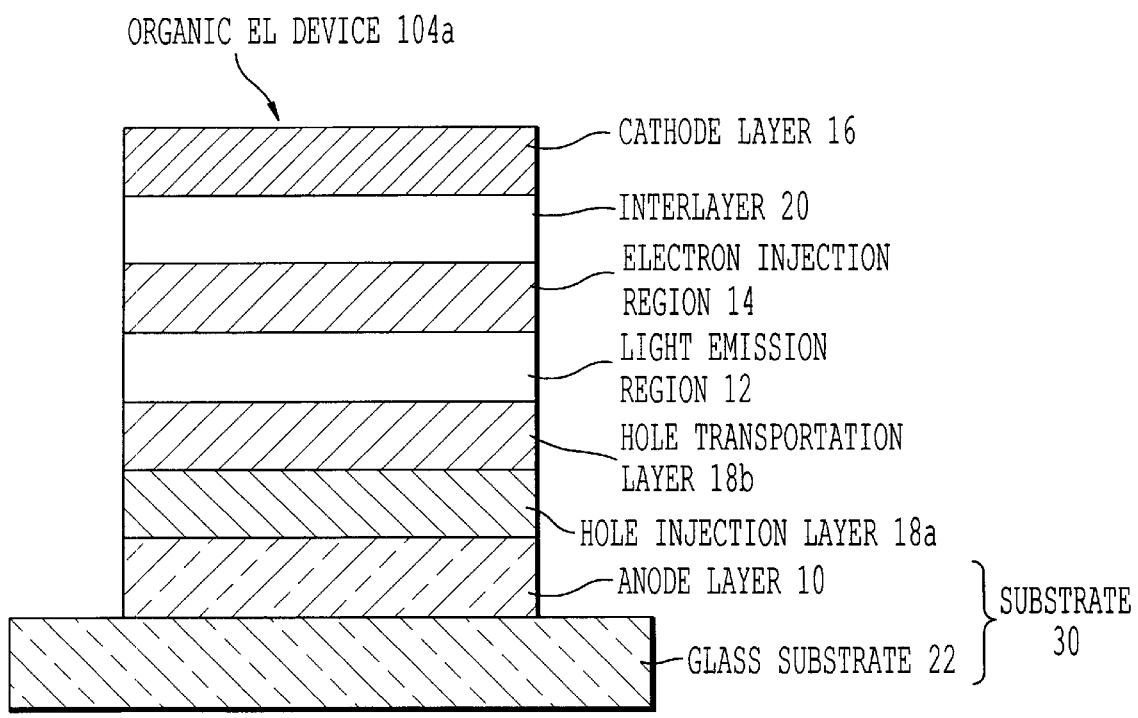
FIG. 6 is a cross-sectional view of an organic EL device of Example 2.

FIG. 6 is referred to for Example 14. The structure of the organic EL device of Example 14 is nearly the same as that of the organic EL device 104 of the fourth embodiment. In Example 14, however, the first interlayer 20 is a BaO (barium oxide) layer having a thickness of 5 nm, which was formed through vaccum evaporation at a deposition rate of 0.1 nm/sec. The other layers except the first interlayer 20 were all the same in their materials and thickness as in Example 1.

As in Example 1, a direct-current voltage of 7 V was applied to the organic EL device fabricated herein. The current density of the device of Example 14 was 2.0 mA/cm$^2$, the luminance thereof was 140 cd/m$^2$, and the half lifetime thereof was 2500 hours. The data obtained are all in Table 4 below.

It is known that the current density, the luminance and the half lifetime of the device of Example 14, as having the first interlayer 20, are all over those of the device of Example 1 not having it.

TABLE 4

| | Example 14 | Example 15 | Example 16 | Example 1 |
|---|---|---|---|---|
| Light Emission Region | EM-1 | EM-1 | EM-1 | EM-1 |
| Electron Injection Region (components) | EM-1/Li | EM-1/Li | EM-1/Li | EM-1/Li |
| Electron Injection Region (molar ratio of components) | 1/1 | 1/1 | 1/1 | 1/1 |
| Interlayer | BaO | LiF | SrO | None |
| Current Density (mA/cm$^2$) | 2.0 | 2.2 | 2.0 | 1.0 |
| Luminance (cd/m$^2$) | 140 | 150 | 100 | 40 |
| Electron Affinity (eV) | 2.8 | 2.8 | 2.8 | 2.8 |
| Half lifetime (hrs) | 2500 | 3000 | 2000 | 1000 |

EXAMPLE 15

Example 15 of the invention is described. The structure of the organic EL device of Example 15 is the same as that of the device of Example 14. In Example 15, however, a LiF (lithium fluoride) layer having a thickness of 5 nm was formed through vaccum evaporation as the first interlayer, in place of the BaO layer. In this, the other layers except the first interlayer 20 were all the same in their materials and thickness as in Example 1.

As in Example 1, a direct-current voltage of 7 V was applied to the organic EL device fabricated herein. The current density of the device of Example 15 was 2.2 mA/cm$^2$, the luminance thereof was 150 cd/m$^2$, and the half lifetime thereof was 3000 hours. The data obtained are all in Table 4.

EXAMPLE 16

Example 16 of the invention is described. The structure of the organic EL device of Example 16 is the same as that of the device of Example 14. In Example 16, however, a SrO (strontium oxide) layer having a thickness of 5 nm was formed through vaccum evaporation as the first interlayer, in place of the BaO layer. In this, the other layers except the first interlayer 20 were all the same in their materials and thickness as in Example 1.

As in Example 1, a direct-current voltage of 7 V was applied to the organic EL device fabricated herein. The current density of the device of Example 16 was 2.0 mA/cm$^2$, the luminance thereof was 100 cd/m$^2$, and the half lifetime thereof was 2000 hours. The data obtained are all in Table 4.

Comparative Example 1

Comparative Example 1 is described. The structure of the organic EL device of Comparative Example 1 is the same as that of the device of Example 1. In Comparative Example 1, however, trinitrofluorenone (TNF) of the following formula (16) was used as the material for the electron injection region, in place of "EM-1". The electron affinity of the electron injection region formed herein was 4.1 eV. In this, the other layers except the electron injection region were all the same in their materials and thickness as in Example 1.

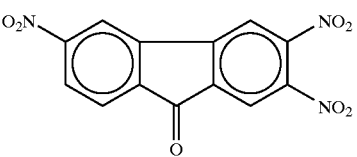

(16)

As in Example 1, a direct-current voltage of 7 V was applied to the organic EL device fabricated herein. The current density of the device was 0.1 mA/cm$^2$, but the luminance thereof could not be detected.

It is believed that, since the electron affinity of the electron injection region of the organic EL device of Comparative Example 1 was 4.1 eV and was high, TNF in the region would have reacted with the component of the light emission region to form some complex, or the excited condition as generated in the light emission region would have transferred to the electron injection region whereby the light emission region would have been inactivated.

Comparative Example 2

Comparative Example 2 is described. The structure of the organic EL device of Comparative Example 2 is the same as that of the device of Example 1. In Comparative Example 2, however, diphenoquinone of the following formula (17) was used as the material for the electron injection region, in place of "EM-1". The glass transition point of the electron injection region formed herein was 50° C. In this, the other layers except the electron injection region were all the same in their materials and thickness as in Example 1.

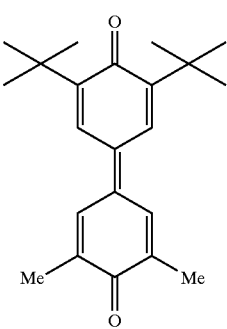

(17)

As in Example 1, a direct-current voltage of 7 V was applied to the organic EL device fabricated herein. The current density of the device was 0.2 mA/cm$^2$, and the device gave a luminance of 2 cd/m$^2$ only in an instant, which, however, was immediately extinguished.

It is believed that, in the organic EL device of Comparative Example 2, since the material of the electron injection region contained nitrogen and since the glass transition point of the region was 50° C. and was low, the electron injection region would have been disrupted by the Joule's heat.

Comparative Example 3

Comparative Example 3 is described. The structure of the organic EL device of Comparative Example 3 is the same as that of the device of Example 1. In Comparative Example 3, however, a nitrogen-containing compound of the following formula (18) was used as the material for the electron injection region, in place of "EM-1". The glass transition point of the electron injection region formed herein was 62° C. In this, the other layers except the electron injection region were all the same in their materials and thickness as in Example 1.

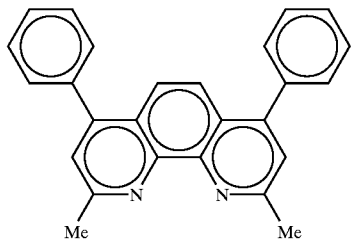

(18)

A direct-current voltage of 6 V was applied to the organic EL device fabricated herein. The current density of the device was 1.0 mA/cm$^2$, and the luminance thereof was 90 cd/m$^2$. However, the half lifetime of the device was only 200 hours. In the pattern of the emission spectrum of the device, seen was a spectral component for red emission.

It is believed that, since the nitrogen-containing compound of formula (18) used in Comparative Example 3 has strong acceptor capabilities, it would have interacted with the component of the light emission region thereby probably resulting in that the device containing the compound in its light emission region would have lost the light emission capabilities. In addition, it is further believed that, since compounds having a molecular weight of not larger than 300 and having a low glass transition point, if used in the electron emission region, would be readily mixed with the component of the light emission region, the compound used herein would have interacted with the component of the light emission region whereby the light emission region would have lost the light emission capabilities.

As has been mentioned in detail hereinabove, the electron injection region in the organic EL device of the first aspect of the invention contains a nitrogen-free aromatic compound and a reducing dopant, and the electron affinity of the electron injection region therein is controlled to fall between 1.8 and 3.6 eV. Accordingly, in the organic EL device of the first aspect, charge-transfer complexes or exciplexes with low luminous efficiency are well prevented from being formed in the interface between the electron injection region and the light emission region, and, in addition, the blocking contact is also well prevented from being formed at the interface between the electron injection region and the light emission region that retards the electron injection from the electron injection region to the light emission region. With those characteristics, therefore, the luminous efficiency of the device is increased and the lifetime thereof is prolonged.

On the other hand, the electron injection region in the organic EL device of the second aspect of the invention contains an electron-transporting compound and a reducing dopant having a work function of at most 2.9 eV, and the electron affinity of the electron injection region therein is controlled to fall between 1.8 and 3.6 eV. Accordingly, in the organic EL device of the second aspect, not only nitrogen-free aromatic compounds but also nitrogen-containing aromatic compounds could be used in the electron injection region. In the device of the second aspect with that constitution, charge-transfer complexes or exciplexes with low luminous efficiency are well prevented from being formed in the interface between the electron injection region and the light emission region, and, in addition, the blocking contact is also well prevented from being formed at the interface between the electron injection region and the light emission region that retards the electron injection from the electron injection region to the light emission region. With those characteristics, therefore, the latitude in selecting the materials for the electron injection region to be in the device of the second aspect is greatly broadened, and, in addition, the luminous efficiency of the device is increased and the lifetime thereof is prolonged.

While the invention has been described in detail and with reference to specific embodiments thereof, it will be apparent to one skilled in the art that various changes and modifications can be made therein without departing from the spirit and scope thereof.

What is claimed is:

1. An organic electroluminescent device comprising at least an anode layer, a light emission region, an electron injection region and a cathode layer laminated in that order, wherein the electron injection region contains a nitrogen-free aromatic compound and a reducing dopant and the electron affinity of the electron injection region is between 1.8 and 3.6 eV and wherein said electron injection region has a glass transition temperature not lower than 100° C.

2. The organic electroluminescent device as claimed in claim 1, wherein said electron injection region has a glass transition temperature between 105 and 200° C.

3. The organic electroluminescent device as claimed in claim 1, wherein said aromatic compound contains a residue of at least one aromatic ring selected from the group consisting of anthracene, fluorene, perylene, pyrene, phenanthrene, chrysene, tetracene, rubrene, terphenylene, quaterphenylene, sexiphenylene, triphenylene, picene, coronene, diphenylanthracene, benz[a]anthracene and binapthalene.

4. The organic electroluminescent device as claimed in claim 1, wherein said aromatic compound contains a residue of at least one aromatic ring selected from the group consisting of styryl-substituted aromatic rings, distyryl-substituted aromatic rings and tris-styrl-substituted aromatic rings.

5. The organic electroluminescent device as claimed in claim 1, wherein said reducing dopant is at least one substance selected from the group consisting of alkali metals, alkaline earth metals, rare earth metals, alkali metal oxides, alkali metal halides, alkaline earth metal oxides, alkaline earth metal halides, rare earth metal oxides and rare earth metal halides.

6. The organic electroluminescent device as claimed in claim 1, wherein said reducing dopant has a work function of at most 3.0 eV.

7. The organic electroluminescent device as claimed in claim 1, wherein said reducing dopant is at least one alkali metal selected from the group consisting of Li, Na, K, Rb and Cs.

8. The organic electroluminescent device as claimed in claim 1, wherein the energy gap in said electron injection region is at least 2.7 eV.

9. The organic electroluminescent device as claimed in claim 1, wherein the ratio of said aromatic compound to said reducing dopant in said electron injection region falls between 1:20 and 20:1 (by mol).

10. The organic electroluminescent device as claimed in claim 1, wherein both said light emission region and said electron injection region contain the same nitrogen-free aromatic compound.

11. The organic electroluminescent device as claimed in claim 1, which additionally has an interlayer between said cathode layer and said electron injection region and/or between said anode layer and said light emission region.

12. The organic electroluminescent device as claimed in claim 1, wherein said reducing dopant is an alkali metal-coordinated compound of the formula $A^+Ar^{6-}$, wherein A is an alkali metal and Ar is an aromatic compound having from 10 to 40 carbon atoms.

13. The organic electroluminescent device as claimed in claim 1, wherein the amount of said reducing dopant is between 0.01 and 50% by weight, relative to the sum total of the components of said electron injection region.

14. The organic electroluminescent device as claimed in claim 1, wherein the ratio of said aromatic compound to said reducing dopant is 1:20 to 20:1 (by mol).

15. An organic electroluminescent device comprising at least an anode layer, a light emission region, an electron injection region and a cathode layer laminated in that order, wherein the electron injection region contains an electron-transporting compound and a reducing dopant having a work function of at most 2.9 eV, and the electron affinity of the electron injection region is between 1.8 and 3.6 eV, wherein said electron injection region has a glass transition temperature between 105 and 200° C.

16. An organic electroluminescent device comprising at least an anode layer, a light emission region, an electron injection region and a cathode layer laminated in that order, wherein the electron injection region contains an electron-transporting compound and a reducing dopant having a work function of at most 2.9 eV, and the electron affinity of the electron injection region is between 1.8 and 3.6 eV, wherein said electron injection region has a glass transition temperature not lower than 100° C.

17. The organic electroluminescent device as claimed in claim 16, wherein said reducing dopant is at least one alkali metal or alkaline earth metal selected from the group consisting of Na, K, Rb, Cs, Ca, Sr and Ba.

18. The organic electroluminescent device as claimed in claim 16, wherein both said light emission region and said electron injection region contain the same electron-transporting compound.

19. The organic electroluminescent device as claimed in claim 16, which additionally has an interlayer between said cathode layer and said electron injection region and/or between said anode layer and said light emission region.

20. The organic electroluminescent device as claimed in claim 16, wherein said electron-transporting compound comprises nitrogen-containing heterocyclic compounds.

21. The organic electroluminescent device as claimed in claim 16, wherein said reducing dopant is an alkali metal-coordinated compound of the formula $A^+Ar^{6-}$, wherein A is an alkali metal and Ar is an aromatic compound having from 10 to 40 carbon atoms.

22. The organic electroluminescent device as claimed in claim 16, wherein said nitrogen-containing heterocyclic compounds are at least one selected from the group consisting of nitrogen-containing complexes, quinoline derivatives, quinoxaline derivatives, oxadiazole derivatives, thiadiazole derivatives and triazole derivatives.

23. The organic electroluminescent device as claimed in claim 16, wherein the amount of said reducing dopant is between 0.01 and 50% by weight, relative to the sum total of the components of said electron injection region.

24. The organic electroluminescent device as claimed in claim 16, wherein the ratio of said electron-transporting compound to said reducing dopant in said electron injection region falls between 1:20 and 20:1 (by mol).

25. The organic electroluminescent device as claimed in claim 16, wherein the ratio of said electron transporting compound to the reducing dopant is 1:20 to 20:1 (by mol).

26. The organic electroluminescent device as claimed in claim 16, wherein said electron transporting compound is a nitrogen-containing heterocyclic compound selected from the group consisting of nitrogen-containing complexes and nitrogen-containing cyclic compounds.

27. The organic electroluminescent device as claimed in claim 16, wherein said nitrogen-containing complexes are metal complexes with ligands of 8-quinolinol derivatives.

28. The organic electroluminescent device as claimed in claim 16, wherein said nitrogen-containing cyclic compounds are oxadiazole derivatives, thiadiazole derivatives, quinoxaline derivatives or quinoline derivatives.

* * * * *